United States Patent
Lee et al.

(10) Patent No.: US 11,151,936 B2
(45) Date of Patent: Oct. 19, 2021

(54) DISPLAY DEVICE

(71) Applicant: Samsung Display Co., Ltd., Yongin-Si (KR)

(72) Inventors: Sunhee Lee, Yongin-si (KR); Sunho Kim, Yongin-si (KR); Juchan Park, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/293,493

(22) Filed: Mar. 5, 2019

(65) Prior Publication Data

US 2019/0347989 A1    Nov. 14, 2019

(30) Foreign Application Priority Data

May 9, 2018 (KR) .................. 10-2018-0053207

(51) Int. Cl.
| | |
|---|---|
| G09G 3/3233 | (2016.01) |
| H01L 27/32 | (2006.01) |
| H01L 51/52 | (2006.01) |
| G09G 3/3266 | (2016.01) |
| G09G 3/3275 | (2016.01) |
| H01L 51/00 | (2006.01) |

(52) U.S. Cl.
CPC ......... *G09G 3/3233* (2013.01); *G09G 3/3266* (2013.01); *G09G 3/3275* (2013.01); *H01L 27/3248* (2013.01); *H01L 27/3258* (2013.01); *H01L 27/3276* (2013.01); *H01L 51/0097* (2013.01); *H01L 51/5237* (2013.01)

(58) Field of Classification Search
CPC .. G09G 3/3233; G09G 3/3266; G09G 3/3275; H01L 27/3248; H01L 27/3258; H01L 27/3276; H01L 51/0097; H01L 51/5237
See application file for complete search history.

(56) References Cited

U.S. PATENT DOCUMENTS

| | | | |
|---|---|---|---|
| 8,933,626 B2 * | 1/2015 | Choi | H04M 1/0268 313/511 |
| 9,429,997 B2 | 8/2016 | Myers et al. | |
| 9,983,714 B2 | 5/2018 | Ahn | |
| 2013/0178248 A1 * | 7/2013 | Kim | H04M 1/0268 455/566 |
| 2013/0265272 A1 * | 10/2013 | Li | G06F 1/169 345/174 |
| 2014/0055702 A1 * | 2/2014 | Park | H01L 27/1218 349/43 |

(Continued)

FOREIGN PATENT DOCUMENTS

| | | |
|---|---|---|
| KR | 10-2017-0106621 A | 9/2017 |
| KR | 10-2017-0139702 A | 12/2017 |

(Continued)

*Primary Examiner* — Michael Pervan
(74) *Attorney, Agent, or Firm* — Innovation Counsel LLP

(57) ABSTRACT

A display device includes: a substrate including a main display area and an edge display area bent with respect to a first axis from the main display area; and a wiring including a plurality of sub-wirings arranged in a direction intersecting the first axis in the edge display area; an insulating layer including a plurality of contact holes and covering the plurality of sub-wirings; and a connection wiring disposed on the insulating layer and connecting the plurality of sub-wirings through the plurality of contact holes.

14 Claims, 20 Drawing Sheets

(56) References Cited

U.S. PATENT DOCUMENTS

| | | | | |
|---|---|---|---|---|
| 2014/0118271 A1* | 5/2014 | Lee | ........................ | G06F 3/0412 |
| | | | | 345/173 |
| 2014/0306985 A1* | 10/2014 | Jeong | ........................ | G09G 5/06 |
| | | | | 345/601 |
| 2014/0354143 A1* | 12/2014 | Jung | ........................ | H05B 33/02 |
| | | | | 313/511 |
| 2015/0014641 A1* | 1/2015 | Jung | ................... | H01L 27/1237 |
| | | | | 257/40 |
| 2016/0116941 A1* | 4/2016 | Kuwabara | ................ | G06F 1/163 |
| | | | | 361/679.03 |
| 2016/0316582 A1* | 10/2016 | Seo | ........................ | H05K 5/0017 |
| 2017/0038641 A1* | 2/2017 | Yamazaki | .......... | G02F 1/133308 |
| 2017/0062756 A1* | 3/2017 | Ahn | ..................... | H01L 51/5253 |
| 2017/0262109 A1 | 9/2017 | Choi et al. | | |
| 2017/0357113 A1* | 12/2017 | Yamazaki | ............ | G02F 1/13471 |
| 2018/0061317 A1* | 3/2018 | Morita | ................. | H01L 29/7869 |
| 2019/0181154 A1* | 6/2019 | Xia | ..................... | H01L 51/0097 |

FOREIGN PATENT DOCUMENTS

| | | | | |
|---|---|---|---|---|
| KR | 10-2018-0000254 A | | 1/2018 | |
| WO | WO-2017082685 A1 * | | 5/2017 | ........... G09G 3/3233 |

\* cited by examiner

DISPLAY DEVICE

CROSS-REFERENCE TO RELATED APPLICATION

This application claims the benefit of Korean Patent Application No. 10-2018-0053207, filed on May 9, 2018, in the Korean Intellectual Property Office, the disclosure of which is incorporated herein in its entirety by reference.

BACKGROUND

1. Field

One or more embodiments of the present disclosure relate to a display device, and, more particularly, to a stereoscopic display device having a bent display area.

2. Description of the Related Art

A stereoscopic display device may be provided by bending at least a part of a display area. According to a type of wirings located in the display area of the stereoscopic display device, a deviation of a bending stress applied to the wirings may be increased when the wirings are bent with respect to a bending axis. The increased deviation of the bending stress may cause a damage to the wirings during a process of bending the display area.

SUMMARY

One or more embodiments of the present disclosure include a stereoscopic display device that may reduce a deviation of stress applied to wirings regardless of a bending axis and a type of the wirings and may have improved reliability. Additional aspects will be set forth in part in the description which follows and, in part, will be apparent from the description, or may be learned by practice of the presented embodiments.

According to one or more embodiments, a display device includes: a substrate including a main display area and an edge display area that is bent with respect to a first axis and extending from the main display area; and a wiring including a plurality of sub-wirings arranged in a direction intersecting the first axis in the edge display area; an insulating layer including a plurality of contact holes and covering the plurality of sub-wirings; and a connection wiring disposed on the insulating layer and connecting the plurality of sub-wirings through the plurality of contact holes.

An elastic modulus of the connection wiring may be less than an elastic modulus of the plurality of sub-wirings.

The display device may further include: a plurality of display elements located in the edge display area; a scan line electrically connected to the plurality of display elements; and a data line electrically connected to the plurality of display elements, wherein the wiring is one of the scan line and the data line.

The display device may further include a thin-film transistor located in the edge display area, the thin-film transistor including a semiconductor layer and a gate electrode, wherein the plurality of sub-wirings and the gate electrode include a same material.

The display device may further include: a driving thin-film transistor located in the edge display area; and a storage capacitor including a lower storage capacitor plate and an upper storage capacitor plate, wherein the driving thin-film transistor and the storage capacitor overlap each other.

The plurality of sub-wirings and the upper storage capacitor plate may include a same material.

The display device may further include at least one inorganic insulating layer disposed between the substrate and the insulating layer, wherein the at least one inorganic insulating layer includes a valley corresponding to a region between adjacent sub-wirings of the plurality of sub-wirings.

The insulating layer may fill the valley and the insulating layer may include an organic insulating material.

The insulating layer may include an inorganic insulating layer that includes an opening corresponding to the valley.

The display device may further include an organic insulating layer filling the valley and the opening.

The display device may further include a side display area connected to the edge display area and located on a plane different from the main display area.

According to one or more embodiments, a display device includes: a substrate including a main display area, a first edge display area located on a first side of the main display area, and a second edge display area located on a second side of the main display area, wherein the first edge display area and the second edge display area are respectively bent with respect to a first axis and a second axis; a plurality of display elements located in the main display area, the first edge display area, and the second edge display area; a wiring electrically connected to the plurality of display elements, the wiring including a plurality of sub-wirings that are located in the first edge display area and spaced apart from one another along an intersecting direction that intersects the first axis; an insulating layer disposed on the plurality of sub-wirings and having a plurality of contact holes; and a plurality of connection wirings disposed on the insulating layer and connecting the plurality of sub-wirings through the contact holes.

The plurality of connection wirings may be located in the first edge display area and are spaced apart from one another along the intersecting direction.

The plurality of connection wirings may cross the first edge display area in the intersecting direction.

An elastic modulus of the plurality of connection wirings may be less than an elastic modulus of the plurality of sub-wirings.

The plurality of connection wirings may include aluminum.

The display device may further include a thin-film transistor including a semiconductor layer and a gate electrode located in the first edge display area, wherein the plurality of sub-wirings and the gate electrode include a same material.

The display device may further include a data line electrically connected to the thin-film transistor, wherein the plurality of connection wirings are interposed between the gate electrode and the data line.

The display device may further include a side display area extending from the first edge display area and located on a plane perpendicular to the main display area.

The display device may further include an encapsulation member covering the main display area, the first edge display area, and the second edge display area.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
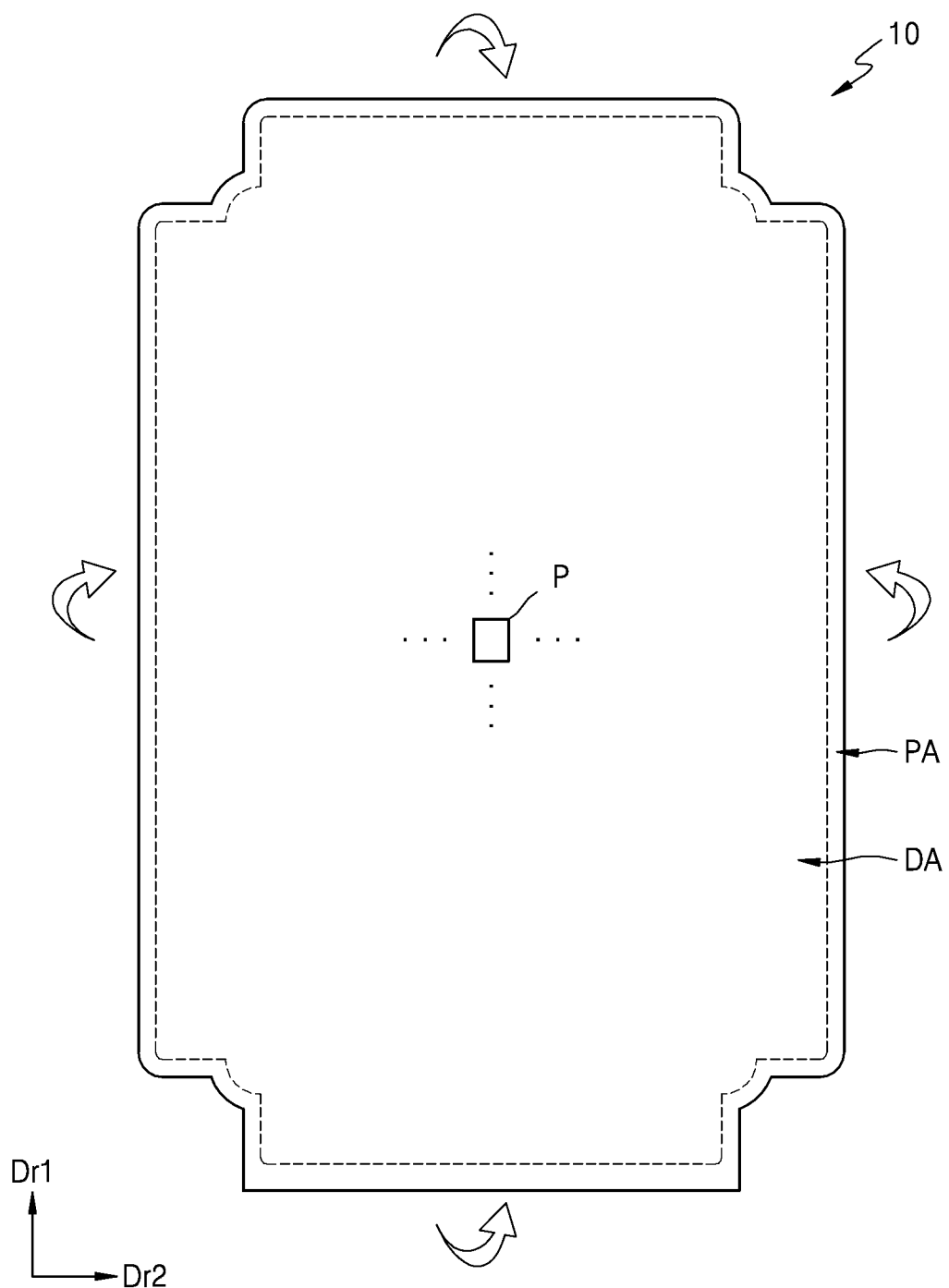
FIG. 1 is a plan view of a display device according to an embodiment.

The present disclosure includes various embodiments and modifications, and embodiments thereof will be illustrated in the drawings and will be described herein in detail. The advantages and features of the present disclosure and methods of achieving the advantages and features will be described more fully with reference to the accompanying drawings, in which embodiments are shown. The present disclosure may, however, be embodied in many different forms and should not be construed as being limited to the embodiments set forth herein.

Reference will now be made in detail to the embodiments, examples of which are illustrated in the accompanying drawings. In the drawings, the same elements are denoted by the same reference numerals, and a repeated explanation thereof may be omitted.

It will be understood that although the terms "first," "second," etc. may be used herein to describe various elements, these elements should not be limited by these terms. These terms are only used to distinguish one element from another.

As used herein, singular forms "a," "an," and "the" are intended to include plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "formed on" another layer, region, or element, it may be directly or indirectly formed on another layer, region, or element. That is, for example, one or more intervening layers, regions, or elements may be present therebetween.

In the accompanying drawings, sizes and thicknesses of elements may be shown as exaggerated for convenience of explanation. In other words, since sizes and thicknesses of elements in the drawings are arbitrarily illustrated for convenience of explanation, the following embodiments may not be limited thereto.

When a certain embodiment may be implemented differently, a specific process order may be different from the described order. For example, two consecutively described processes may be performed substantially at the same time or performed in an order opposite to the described order.

It will be understood that when a layer, a region, or an element is referred to as being "connected to" another layer, region, or element, it may be directly connected to the another layer, region, or element or one or more intervening layers, regions, or elements may be present. For example, It will be understood that when a layer, a region, or an element is referred to as being "electrically connected to" another layer, region, or element, it may be directly electrically connected to the other layer, region, or element or one or more intervening layers, regions, or elements may be present.

As used herein, the term "and/or" includes any and all combinations of one or more of the associated listed items. Expressions such as "at least one of," when preceding a list of elements, may modify the entire list of elements and may not modify the individual elements of the list.

Figure 2:
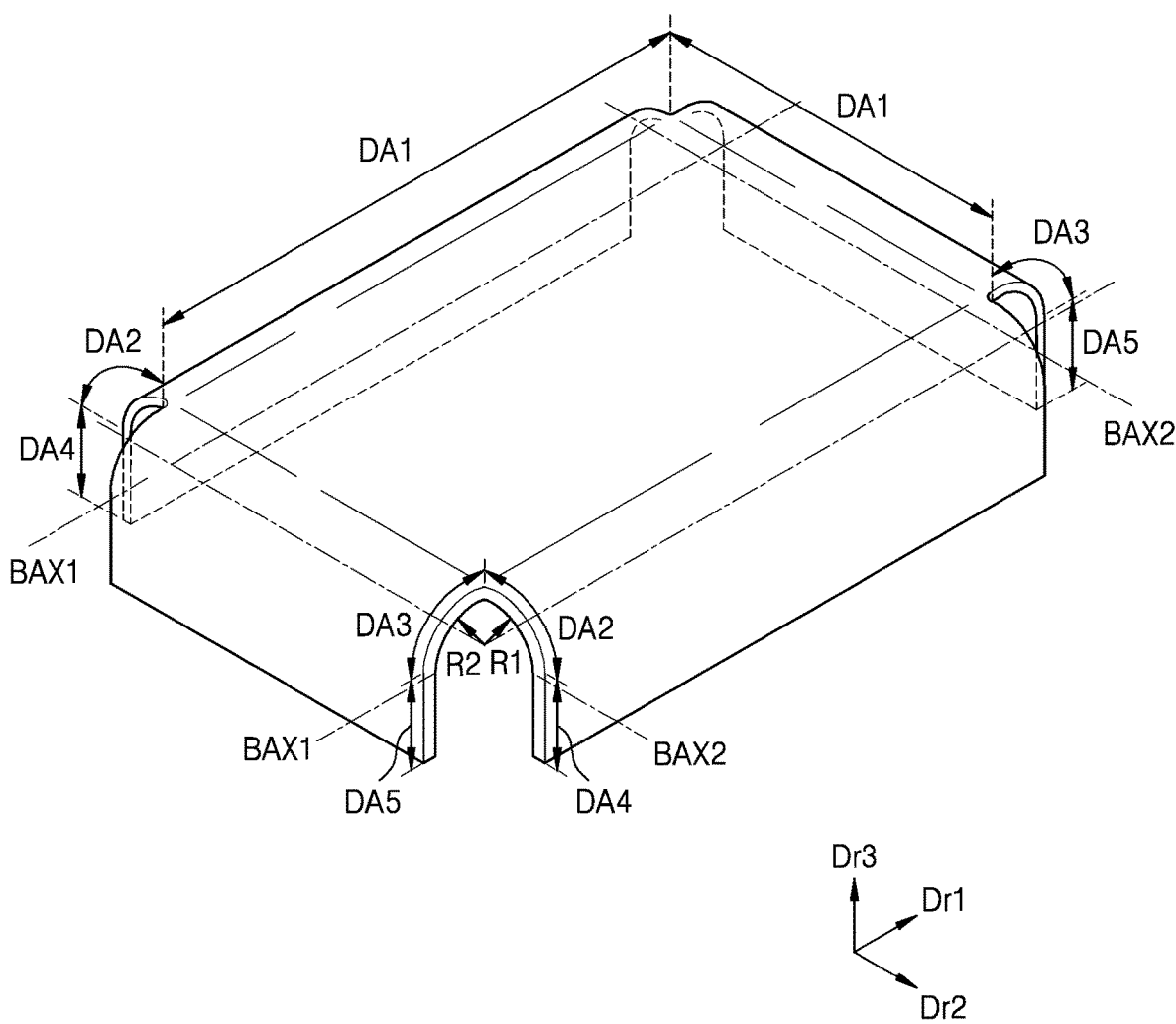
FIG. 2 is a perspective view of the display device of FIG. 1.

FIG. 1 is a plan view of a display device 10 according to an embodiment. FIG. 2 is a perspective view of the display device 10 of FIG. 1.

The display device 10 includes a display area DA in which a plurality of pixels P are located and a peripheral area PA that is disposed at a perimeter of the display area DA. A driver for applying an electrical signal or a power signal to the pixels P may be located in the peripheral area PA that is a non-display area. The peripheral area PA may include one or more pads to which an electronic element or a printed circuit board may be electrically connected.

FIG. 1 may represent a substrate of the display device 10 during a manufacturing process. For example, the substrate may have the display area DA and the peripheral area PA. In the display device 10 or an electronic apparatus including the display device 10, a part of the display area DA and the substrate may be bent. For example, the display area DA of FIG. 1 may be bent with respect to a plurality of axes. FIG. 2 illustrates that the display area DA is bent with respect to four axes.

Referring to FIG. 2, the display area DA may include a main display area DA1, first and second edge display areas DA2 and DA3 that are bent from the main display area DA1, and first and second side display areas DA4 and DA5 that extend from the first and second edge display areas DA2 and DA3 and are located on a plane different from the main display area DA1 (e.g., a plane that is perpendicular to the main display area DA1).

The first edge display area DA2 may be bent with respect to a first axis BAX1 that extends in a first direction (e.g., a direction Dr1), and the second edge display area DA3 may be bent with respect to a second axis BAX2 that extends in a second direction (e.g., a direction Dr2) and intersects the first direction. The first edge display area DA2 may be bent outward along the first axis BAX1 to have a first radius of curvature R1, and the second edge display area DA3 may be bent outward along the second axis BAX2 to have a second radius of curvature R2. The first and second radii of curvature R1 and R2 may be the same or different from each other.

In the embodiment shown in FIGS. 1 and 2, the main display area DA1 has a rectangular shape, the first axis BAX1 is a long axis, and the second axis BAX2 is a short axis. However, it is understood that the present disclosure is not limited thereto. In another embodiment, the first axis BAX1 may be a short axis, and the second axis BAX2 may be a long axis. In another embodiment, the main display area DA1 may have a polygonal shape such as a triangular shape, a pentagonal shape, and a hexagonal shape.

Figure 3:
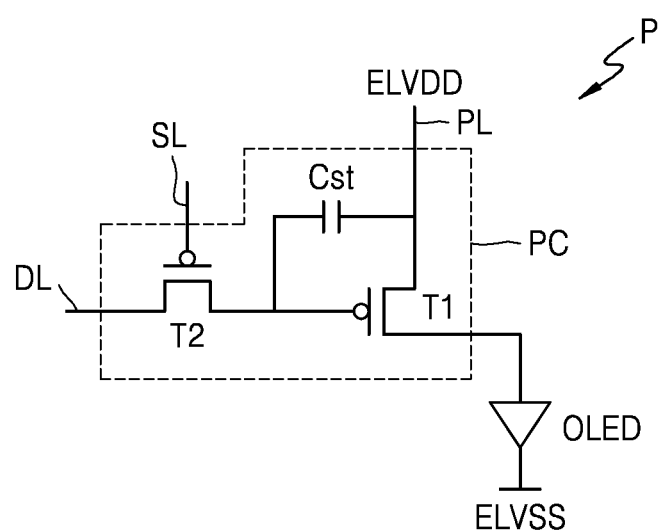
FIG. 3 is an equivalent circuit diagram of a pixel of the display device according to an embedment.

FIG. 3 is an equivalent circuit diagram of a pixel of the display device 10 according to an embodiment.

Each pixel P located in the display area DA of the display device 10 includes a pixel circuit PC and a display element that is connected to the pixel circuit PC. In FIG. 3, an organic light-emitting diode (OLED) is illustrated as an example of the display element.

The pixel circuit PC may include a first thin-film transistor (TFT) T1, a second TFT T2, and a storage capacitor Cst.

The second TFT T2 is a switching TFT that is connected to a scan line SL and a data line DL, and transmits a data voltage input from the data line DL to the first TFT T1 based on a switching voltage input from the scan line SL. The storage capacitor Cst is connected to the second TFT T2 and a driving voltage line PL, and stores a voltage corresponding to a difference between a voltage transmitted from the second TFT T2 and a voltage ELVDD that is supplied to the driving voltage line PL.

The first TFT T1 is a driving TFT that is connected to the driving voltage line PL and the storage capacitor Cst. The first TFT T1 may control a driving current Id that flows through the OLED from the driving voltage line PL based on the voltage stored in the storage capacitor Cst. The OLED may emit light having a predetermined luminance based on the driving current Id. Although the pixel circuit PC includes two TFTs and one storage capacitor in the embodiment shown in FIG. 3, the present disclosure is not limited thereto. The number of TFTs and the number of storage capacitors may be variously changed according to a design of the pixel circuit PC.

Figure 4:
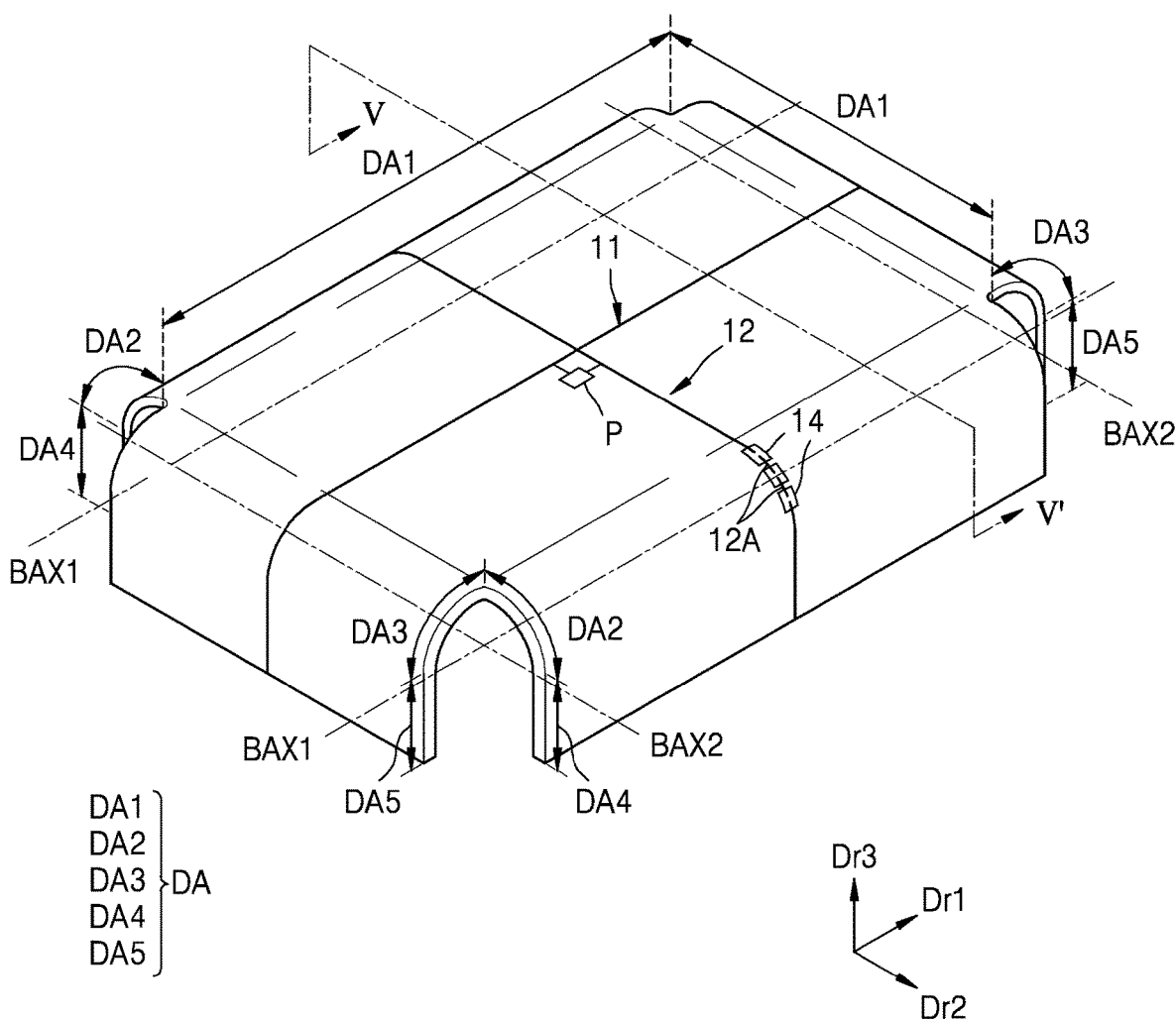
FIG. 4 is a perspective view of the display device according to an embodiment.

FIG. 4 is a perspective view of the display device 10 according to an embodiment.

Referring to FIG. 4, the plurality of pixels P located in the display area DA of the display device 10 are electrically connected to wirings that cross the display area DA. FIG. 4 illustrates that one pixel P is electrically connected to first and second wirings 11 and 12. The first wiring 11 may be the data line DL or the driving voltage line PL described with reference to FIG. 3, and the second wiring 12 may be the scan line SL described with reference to FIG. 3.

The first and second wirings 11 and 12 respectively extend in different directions in the display area DA, for example, the first direction (e.g., the direction Dr1) and the second direction (e.g., the direction Dr2). The first and second wirings 11 and 12 may be located on different layers with at least one insulating layer therebetween and may include different metal materials. In an embodiment, the first wiring 11 may include a metal having ductility higher than that of the second wiring 12. The first wiring 11 including a metal having high ductility (e.g., aluminum (Al)) may be integrally formed to pass through the main display area DA1, the second edge display area DA3, and the second side display area DA5. In contrast, the second wiring 12 including a metal having relatively low ductility (e.g., molybdenum (Mo)) may be damaged by stress when the display area DA is bent with respect to the first axis BAX1, and there may be a limitation in reducing the radius of curvature R1 along the first axis BAX1 when the display area DA is bent.

However, according to an embodiment, portions of the second wiring 12 corresponding to the main display area DA1 and the first side display area DA4 may continuously extend to cross the main and first side display areas DA1 and DA4, whereas portions of the second wiring 12 corresponding to the first edge display area DA2 may discontinuously extend. Hereinafter, the portions of the second wiring 12 that are separated each other along the second direction in the first edge display area DA2 are referred to as sub-wirings 12A. The second wiring 12 including the sub-wirings 12A that are separated from one another in the first edge display area DA2 may prevent a problem that can occur when the second wiring 12 continuously extends in the first edge display area DA2, for example, a damage to the second wiring 12 due to a bending stress, and hence the radius of curvature R1 of the first edge display area DA2 may be reduced. The sub-wirings 12A that are separated from one another in the first edge display area DA2 are connected by a plurality of connection wirings 14, which will be discussed in further detail below.

Figure 5A:
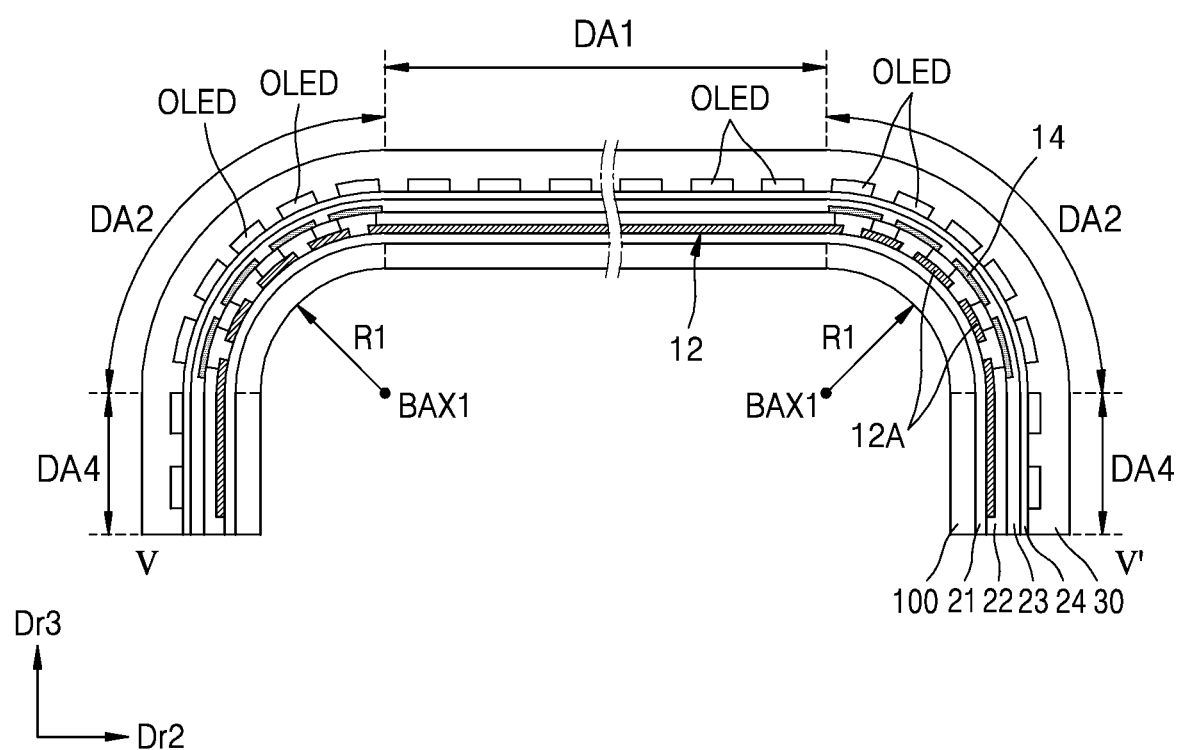
FIG. 5A is a cross-sectional view taken along line V-V' of FIG. 4.
Figure 5B:
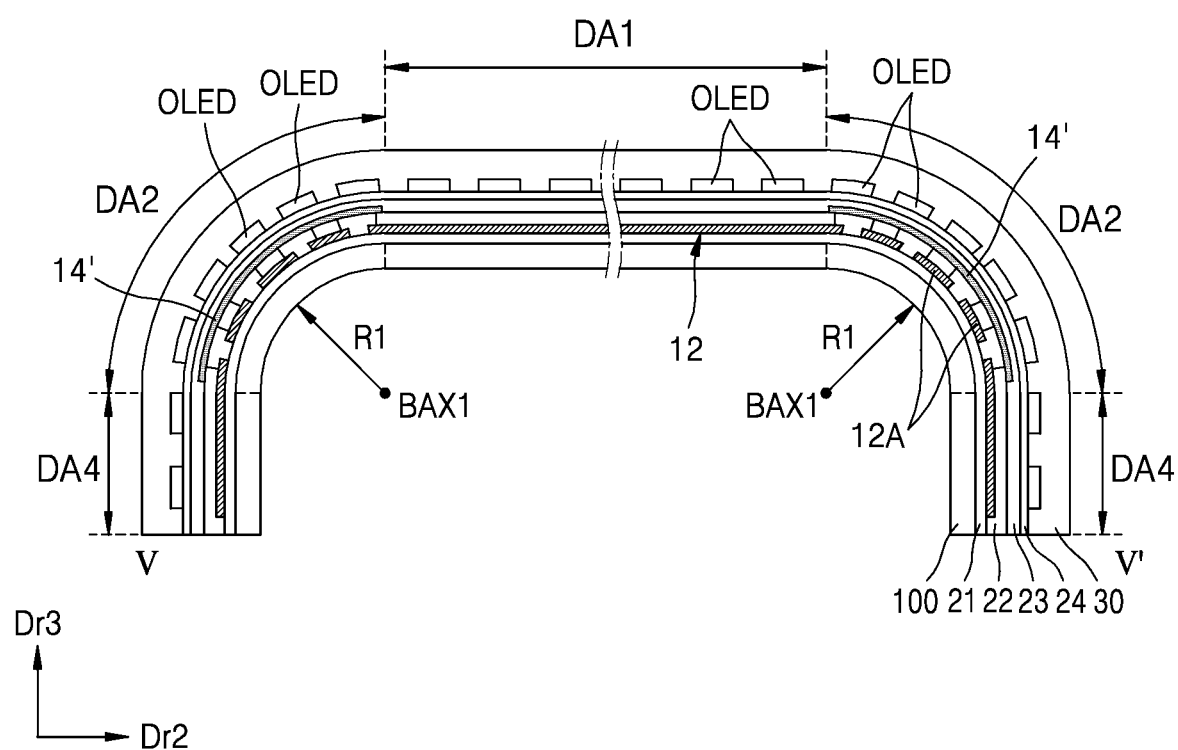
FIG. 5B is a view illustrating a modification to FIG. 5A.

FIG. 5A is a cross-sectional view taken along line V-V' of FIG. 4. FIG. 5B is a view illustrating a modification to FIG. 5A.

Referring to FIG. 5A, a first insulating layer 21 is located on a substrate 100, and the second wiring 12 that includes the sub-wirings 12A is located on the first insulating layer 21. The second wiring 12 extends in a direction intersecting the first axis BAX1 that is a bending axis of the first edge display area DA2. The substrate 100 may include any one of various flexible or bendable materials. For example, the substrate 100 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), and cellulose acetate propionate (CAP).

The second wiring 12 continuously extends in the main display area DA1, and the sub-wirings 12A are separated from one another in the first edge display area DA2. The sub-wirings 12A may be covered by a second insulating layer 22. The adjacent sub-wirings 12A are connected to each other through the connection wirings 14 that are located on the second insulating layer 22. The connection wirings 14 may contact the adjacent sub-wirings 12A through contact holes formed in the second insulating layer 22. The first insulating layer 21 may include silicon oxide or silicon nitride. The second insulating layer 22 may include an inorganic insulating material such as silicon nitride, silicon oxide, and silicon oxynitride, or may include an organic insulating material such as polyimide.

Since the separated sub-wirings 12A are connected through the connection wirings 14, the OLEDs of the pixels P that are arranged in the direction Dr2 in which the second wiring 12 extends may receive the same signal, for example, the same scan signal. The OLEDs may be located on a fourth insulating layer 24 that covers the connection wirings 14 and may be covered by an encapsulation member 30. FIG. 5A shows that a third insulating layer 23 is between the second insulating layer 22 and the fourth insulating layer 24. In another embodiment, the third insulating layer 23 may be omitted.

The connection wirings 14 may include a metal that has an elastic modulus less than that of the second wiring 12. In this case, the connection wirings 14 may be softer than the second wiring 12. As a non-limiting example, the second wiring 12 includes molybdenum (Mo), and the connection wirings 14 includes aluminum (Al).

Although the connection wirings 14 are separated from one another in a direction that intersects the first axis BAX1 in the first edge display area DA2 in FIG. 5A, the present disclosure is not limited thereto.

As shown in FIG. 5B, a connection wiring 14' may be located in the first edge display area DA2 and may continuously extend in a direction that intersects the first axis BAX1. The continuous connection wiring 14' may simultaneously connect the plurality of sub-wirings 12A through a plurality of contact holes formed in the second insulating layer 22.

Although the second wiring 12 includes the sub-wirings 12A that are separated from one another in the first edge display area DA2 in FIGS. 4 through 5B, the present disclosure is not limited thereto.

Figure 6:
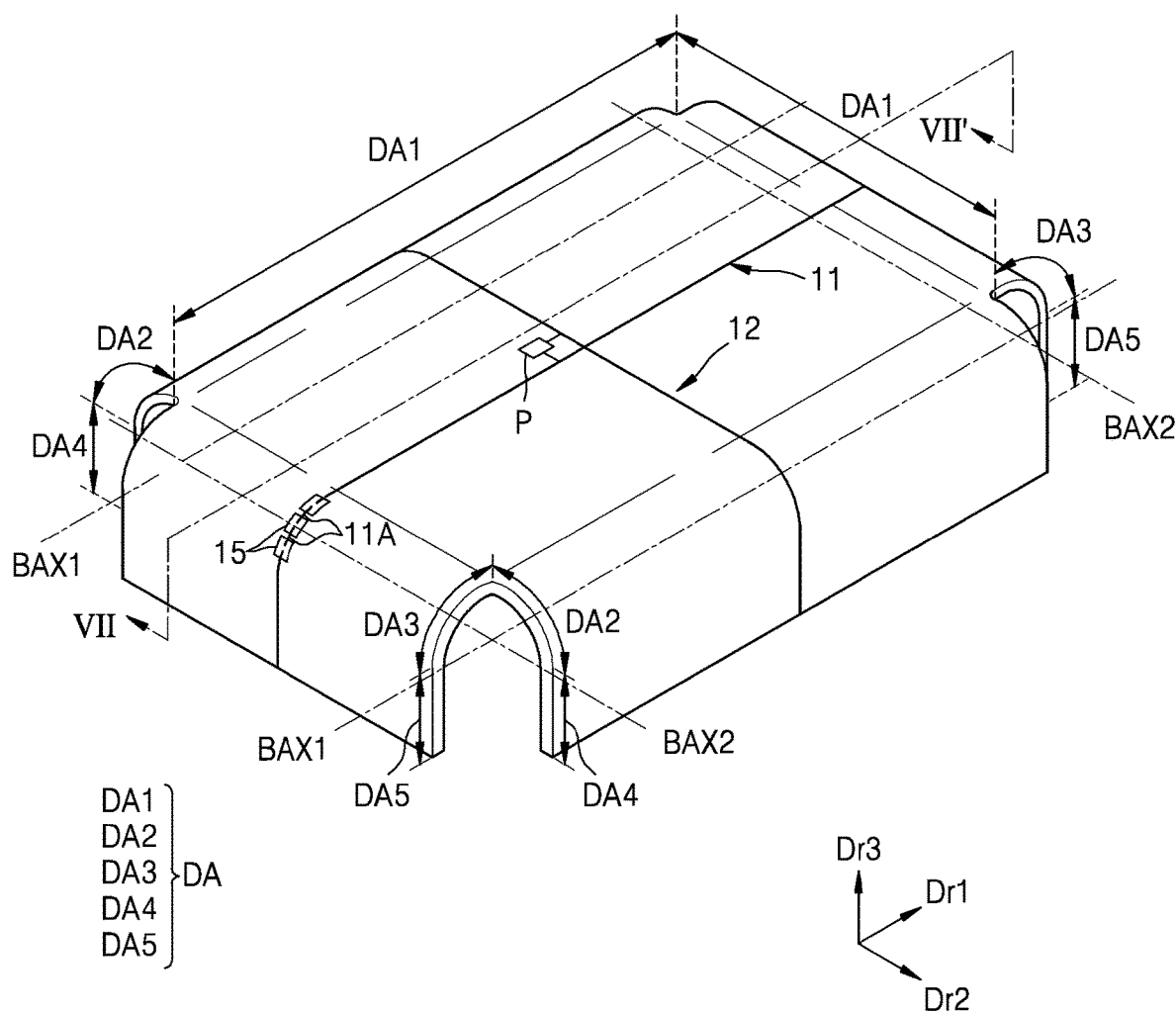
FIG. 6 is a perspective view of the display device according to another embodiment.
Figure 7A:
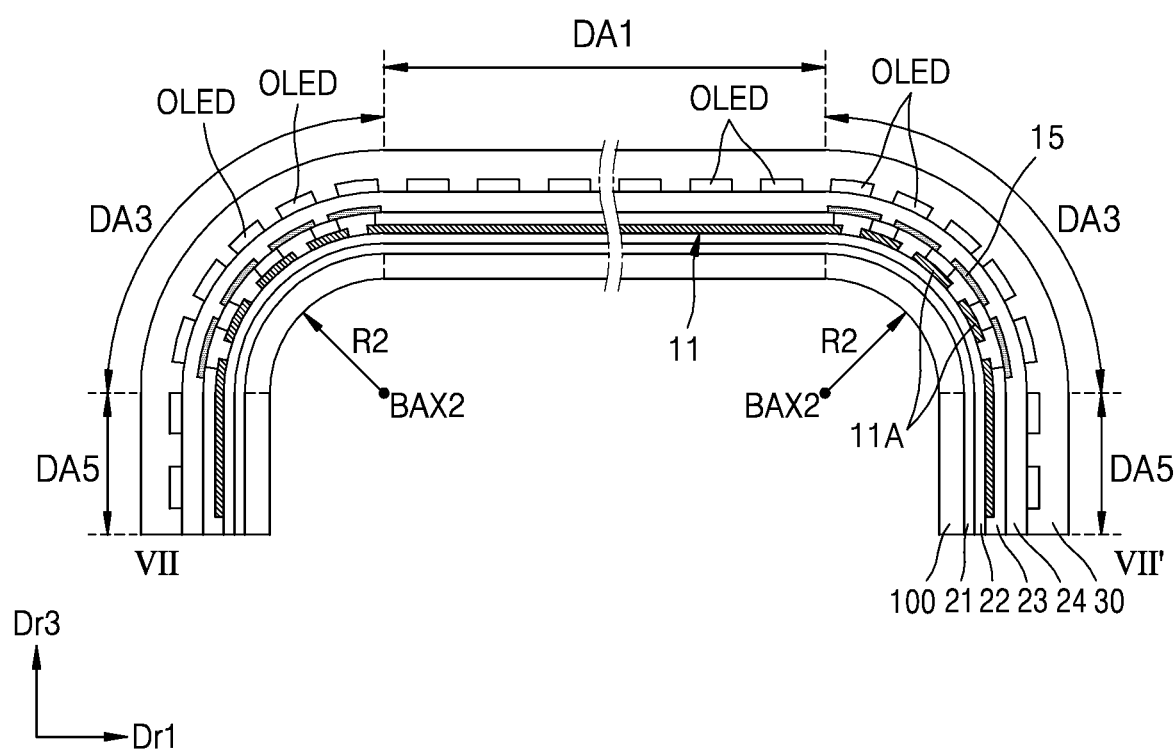
FIG. 7A is a cross-sectional view taken along line VII-VII' of FIG. 6.
Figure 7B:
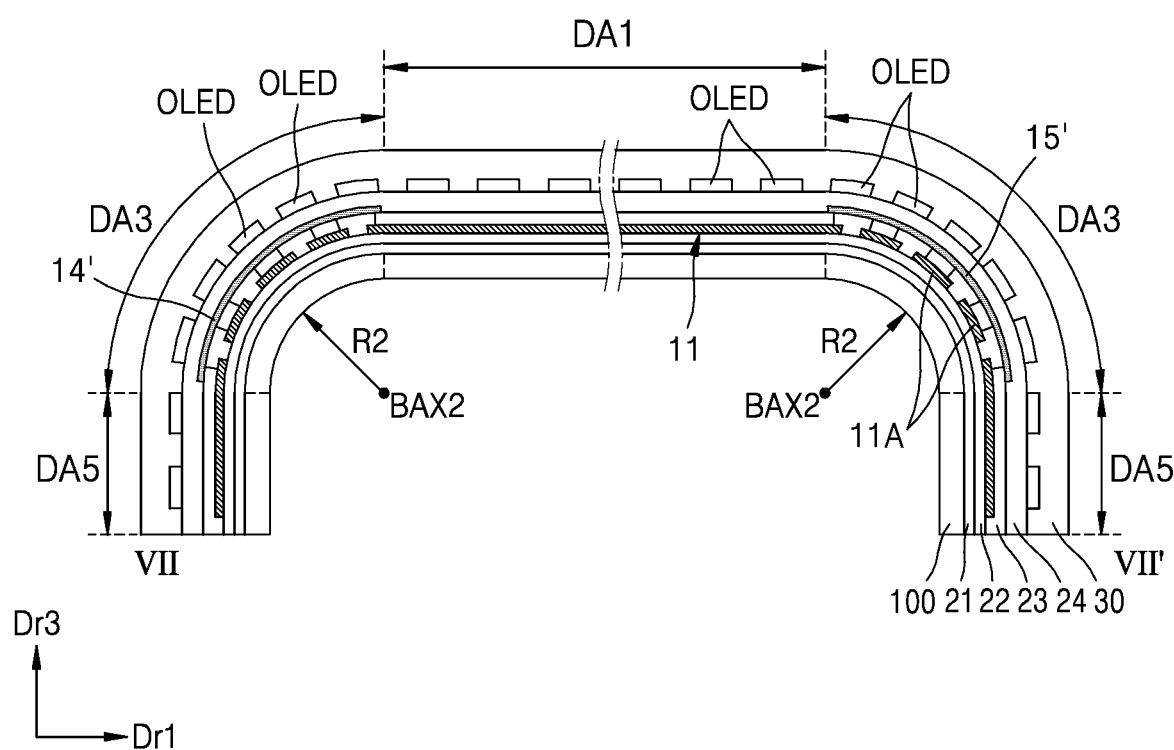
FIG. 7B is a view illustrating a modification to FIG. 7A.

FIG. 6 is a perspective view of the display device 10 according to another embodiment. FIG. 7A is a cross-sectional view taken along line VII-VII' of FIG. 6. FIG. 7B is a view illustrating a modification to FIG. 7A.

Referring to FIGS. 6 and 7A, a first insulating layer 21 is located on the substrate 100, and a second insulating layer 22 is located on the first insulating layer 21. The first wiring 11 is located on the second insulating layer 22. The second wiring 12 may include a metal that has ductility higher than that of the first wiring 11. The first wiring 11 may extend in a direction intersecting the second axis BAX2 that is a bending axis of the second edge display area DA3, and portions of the first wiring 11 corresponding to the second edge display area DA3 may discontinuously extend.

For example, portions of the first wiring 11 corresponding to the main display area DA1 and the second side display area DA5 may continuously extend to cross the main and second side display areas DA1 and DA5, whereas portions of the first wiring 11 corresponding to the second edge display area DA3 may discontinuously extend. Hereinafter, the portions of the first wiring 11 that are separated each other in the second edge display area DA3 are referred to as sub-wirings 11A. The sub-wirings 11A of the first wiring 11 are separated from one another in the second edge display area DA3 to reduce stress. The sub-wirings 11A may be covered by a third insulating layer 23. The sub-wirings 11A are connected by connection wirings 15 that are located on the third insulating layer 23. The connection wirings 15 may contact the sub-wirings 11A through a plurality of contact holes formed in the third insulating layer 23. The third insulating layer 23 may include an inorganic insulating material such as silicon nitride, silicon oxide, and silicon oxynitride, or may include an organic insulating material such as polyimide.

The connection wirings 15 may be separated from one another in a direction intersecting the second axis BAX2 in the second edge display area DA3 to connect adjacent sub-wirings 11A as shown in FIG. 7A. Alternatively, the connection wiring 15' may continuously extend in a direction intersecting the second axis BAX2 in the second edge display area DA3 to simultaneously connect the sub-wirings 11A as shown in FIG. 7B. Each of the connection wirings 15 and 15' may include a metal having an elastic modulus less than that of the sub-wirings 11A.

The first wiring 11 may be a data line described with reference to FIG. 3. The first and second insulating layers 21 and 22 including, for example, silicon oxide or silicon nitride, may be located between the sub-wirings 11A and the substrate 100. The OLEDs of pixels connected to the first wiring 11 may receive the same signal, for example, the same data signal. The OLEDs may be located on a fourth insulating layer 24 (e.g., an organic insulating layer) that covers the connection wirings 15 or 15' and may be covered by the encapsulation member 30.

Figure 8:
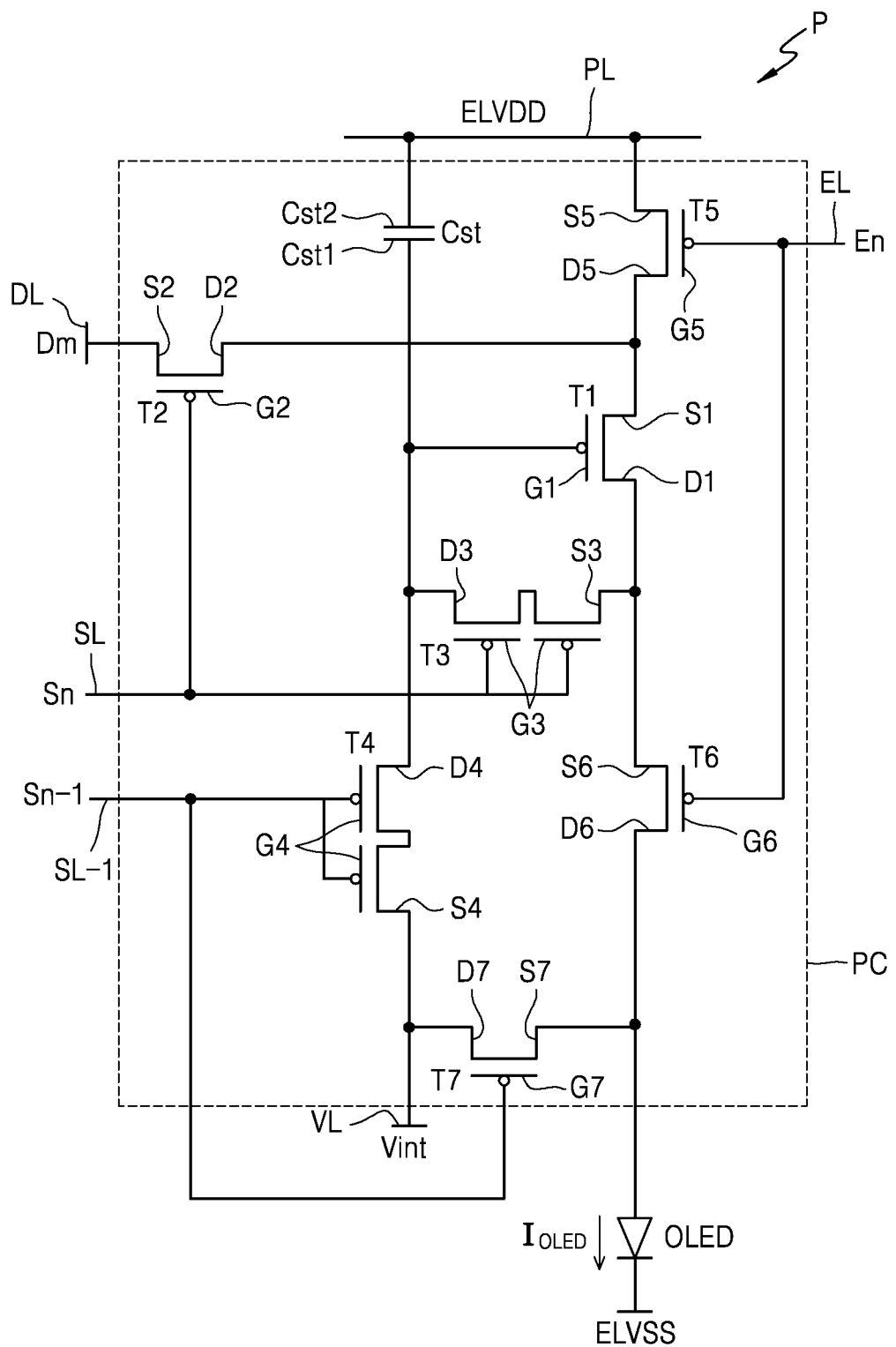
FIG. 8 is an equivalent circuit diagram of a pixel of the display device according to another embodiment.

FIG. 8 is an equivalent circuit diagram of a pixel of the display device 10 according to another embodiment.

Referring to FIG. 8, the pixel circuit PC may include the first TFT T1, the second TFT T2, a third TFT T3, a fourth TFT T4, a fifth TFT T5, a sixth TFT T6, and a seventh TFT T7.

A signal line includes the scan line SL for transmitting a scan signal Sn, a previous scan line SL−1 for transmitting a previous scan signal Sn−1 to the fourth TFT T4 and the seventh TFT T7, an emission control line EL for transmitting a control signal En to the fifth TFT T5 and the sixth TFT T6, and the data line DL for transmitting a data signal Dm. The data line LD intersects the scan line SL. The driving voltage line PL transmits a driving voltage ELVDD to the first TFT T1, and an initialization voltage line VL transmits an initialization voltage Vint for initializing the first TFT T1 and a pixel electrode of the OLED. The operation of the pixel circuit PC will be discussed below in further detail.

The first TFT T1 is a driving TFT, and a driving gate electrode G1 of the first TFT T1 is connected to a first storage capacitor plate Cst1 of the storage capacitor Cst, a driving source electrode S1 of the first TFT T1 is connected to the driving voltage line PL via the fifth TFT T5, and a driving drain electrode D1 of the first TFT T1 is electrically connected to the pixel electrode of the OLED via the sixth TFT T6. The first TFT T1 receives the data signal Dm on the driving source electrode S1 according to a switching operation of the second TFT T2, and supplies driving current $I_{OLED}$ to the OLED.

The second TFT T2 is a switching TFT, and a switching gate electrode G2 of the second TFT T2 is connected to the scan line SL, a switching source electrode S2 of the second TFT T2 is connected to the data line DL, and a switching drain electrode D2 of the second TFT T2 is connected to the driving source electrode S1 of the first TFT T1 and is connected to the driving voltage line PL via the fifth TFT T5. The second TFT T2 is turned on according to the scan signal Sn received through the scan line SL and performs a switching operation of transmitting the data signal Dm transmitted through the data line DL to the driving source electrode S1 of the first TFT T1.

The third TFT T3 is a compensation TFT, and a compensation gate electrode G3 of the third TFT T3 is connected to the scan line SL, a compensation source electrode S3 of the third TFT T3 is connected to the driving drain electrode D1 of the first TFT T1 and is connected to the pixel electrode of the OLED via the sixth TFT T6, and a compensation drain electrode D3 of the third TFT T3 is simultaneously connected to the first storage capacitor plate Cst1 of the storage capacitor Cst, a first initialization drain electrode D4 of the fourth TFT T4, and the driving gate electrode G1 of the first TFT T1. The third TFT T3 is turned on according to the scan signal Sn received through the scan line SL, and diode-connects the first TFT T1 by electrically connecting the driving gate electrode G1 to the driving drain electrode D1 of the first TFT T1.

The fourth TFT T4 is a first initialization TFT, and a first initialization gate electrode G4 of the fourth TFT T4 is connected to the previous scan line SL−1, a first initialization source electrode S4 of the fourth TFT T4 is connected to a second initialization drain electrode D7 of the seventh TFT T7 and the initialization voltage line VL, and the first initialization drain electrode D4 of the fourth TFT T4 is simultaneously connected to the first storage capacitor plate Cst1 of the storage capacitor Cst, the compensation drain electrode D3 of the third TFT T3, and the driving gate electrode G1 of the first TFT T1. The fourth TFT T4 is turned on according to the previous scan signal Sn−1 received through the previous scan line SL−1 and performs an initialization operation of initializing a voltage of the driving gate electrode G1 of the first TFT T1 by transmitting the initialization voltage Vint to the driving gate electrode G1 of the first TFT T1.

The fifth TFT T5 is an operation control TFT, and an operation control gate electrode G5 of the fifth TFT T5 is connected to the emission control line EL, an operation control source electrode S5 of the fifth TFT T5 is connected to the driving voltage line PL, and an operation control drain electrode D5 of the fifth TFT T5 is connected to the driving source electrode S1 of the first TFT T1 and the switching drain electrode D2 of the second TFT T2.

The sixth TFT T6 is an emission control TFT, and an emission control gate electrode G6 of the sixth TFT T6 is connected to the emission control line EL, an emission control source electrode S6 of the sixth TFT T6 is connected to the driving drain electrode D1 of the first TFT T1 and the compensation source electrode S3 of the third TFT T3, and an emission control drain electrode D6 of the sixth TFT T6 is electrically connected to a second initialization source electrode S7 of the seventh TFT T7 and the pixel electrode of the OLED.

The fifth TFT T5 and the sixth TFT T6 are simultaneously turned on according to the control signal En received through the emission control line EL, and the driving voltage ELVDD is applied to the pixel electrode of the OLED to turn on the OLED by allowing the driving current $I_{OLED}$ to flow through the OLED.

The seventh TFT T7 is a second initialization TFT, and a second initialization gate electrode G7 of the seventh TFT T7 is connected to the previous scan line SL−1, the second initialization source electrode S7 of the seventh TFT T7 is connected to the emission control drain electrode D6 of the sixth TFT T6 and the pixel electrode of the OLED, and the second initialization drain electrode D7 of the seventh TFT T7 is connected to the first initialization source electrode S4 of the fourth TFT T4 and the initialization voltage line VL. The seventh TFT T7 is turned on according to the previous scan signal Sn−1 received through the previous scan line SL−1 and initializes the pixel electrode of the OLED.

Figure 9:
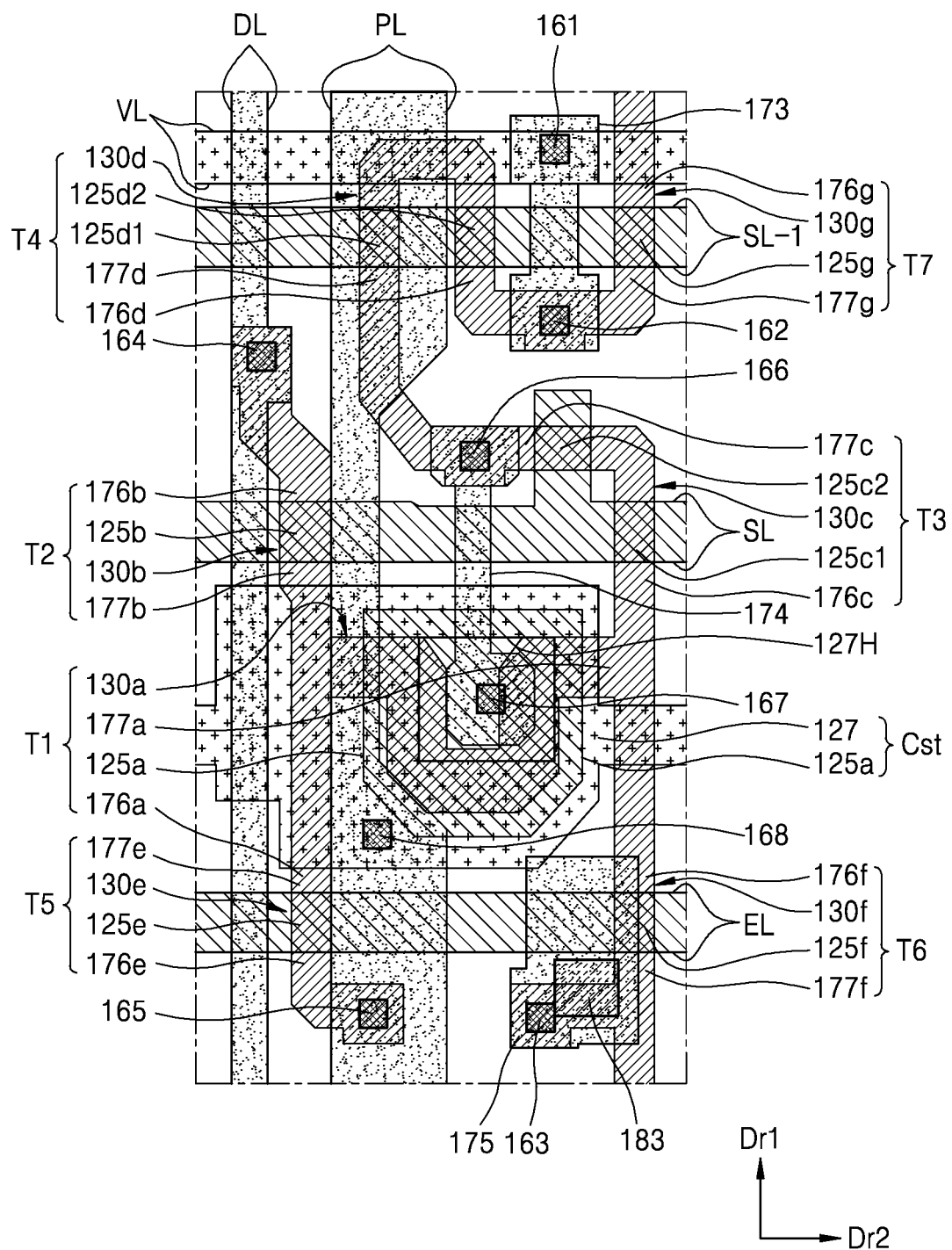
FIG. 9 is a plan view illustrating a pixel of the display device according to an embodiment.

FIG. 9 is a plan view illustrating a pixel of the display device 10 according to an embodiment. The pixel P of FIG. 9 includes the pixel circuit PC described with reference to FIG. 8.

Referring to FIG. 9, the first through seventh TFTs T1 through T7 may be formed along a semiconductor layer, and the semiconductor layer may be bent into any of various shapes.

The semiconductor layer may include a driving semiconductor layer 130a of the first TFT T1, a switching semiconductor layer 130b of the second TFT T2, a compensation semiconductor layer 130c of the third TFT T3, a first initialization semiconductor layer 130d of the fourth TFT T4, an operation control semiconductor layer 130e of the fifth TFT T5, an emission control semiconductor layer 130f of the sixth TFT T6, and a second initialization semiconductor layer 130g of the seventh TFT T7 that may be connected to one another. The semiconductor layer may include polysilicon. Alternatively, the semiconductor layer may include amorphous silicon, polycrystalline silicon, an oxide semiconductor, or an organic semiconductor material. The semiconductor layer may include a channel region, and a source region and a drain region that are located on both sides of the channel region. The channel region is a region where the scan line SL, the previous scan line SL−1, the emission control line EL, or a driving gate electrode 125a (i.e., the driving gate electrode G1 of FIG. 8) overlap the semiconductor layer. The source region and the drain region may be regions that may be doped with impurities by using the scan line SL, the previous scan line SL−1, the emission control line EL, and the driving gate electrode 125a as self-alignment masks and may correspond to a source electrode and a drain electrode.

The first TFT T1 includes the driving semiconductor layer 130a and the driving gate electrode 125a. The driving semiconductor layer 130a includes a driving source region 176a and a driving drain region 177a that may be doped with impurities and a driving channel region located between the driving source region 176a and the driving drain region 177a. The driving channel region may correspond to a portion of the driving semiconductor layer 130a overlapping the driving gate electrode 125a. The driving channel region may have a curved shape as shown in FIG. 9.

The storage capacitor Cst may overlap the first TFT T1. The storage capacitor Cst includes a lower storage capacitor plate (i.e., the first storage capacitor plate Cst1 of FIG. 8) and an upper storage capacitor plate 127 (e.g., a second storage capacitor plate Cst2 of FIG. 8) that overlap each other. For example, the lower storage capacitor plate may be the driving gate electrode 125a of the first TFT T1. Hereinafter, for the sake of convenience, the lower storage capacitor plate may also be referred to as 125a that designates the driving gate electrode 125a of the first TFT T1. When the storage capacitor Cst and the first TFT T1 are designed to overlap each other, and a pixel size is reduced to achieve a high resolution and a high-quality image, the area to form the lower storage capacitor plate 125a and the upper storage capacitor plate 127 may be sufficiently secured. The upper storage capacitor plate 127 may be electrically connected to the driving voltage line PL through a contact hole 168.

The second TFT T2 includes the switching semiconductor layer 130b and a switching gate electrode 125b (i.e., the switching gate electrode G2 of FIG. 8). The switching semiconductor layer 130b includes a switching source region 176b and a switching drain region 177b that may be doped with impurities, and a switching channel region located between the switching source region 176b and the switching drain region 177b. The switching channel region may correspond to a portion of the switching semiconductor layer 130b overlapping the switching gate electrode 125b, and the switching gate electrode 125b may correspond to a portion of the scan line SL. The switching source region 176b may be electrically connected to the data line DL through a contact hole 164, and the switching drain region 177b may be connected to the first TFT T1 and the fifth TFT T5.

The third TFT T3 includes the compensation semiconductor layer 130c and compensation gate electrodes 125c1 and 125c2 (i.e., the compensation gate electrode G3 of FIG. 8). The compensation semiconductor layer 130c includes a compensation source region 176c and a compensation drain region 177c that may be doped with impurities, and a compensation channel region located between the compensation source region 176c and the compensation drain region 177c. The compensation channel region may correspond to a portion of the compensation semiconductor layer 130c overlapping the compensation gate electrodes 125c1 and 125c2, and the compensation gate electrodes 125c1 and 125c2 may correspond to a portion of the scan line SL.

The compensation drain region 177c of the third TFT T3 and a first initialization drain region 177d of the fourth TFT T4 may be connected to the storage capacitor Cst through a node connecting line 174. An end of the node connecting line 174 may be connected to the compensation drain region 177c and the first initialization drain region 177d through a contact hole 166, and the other end of the node connecting line 174 may be connected to the lower storage capacitor plate 125a through a contact hole 167. In this case, a storage opening 127H corresponding to the contact hole 167 may be formed in the upper storage capacitor plate 127 of the storage capacitor Cst.

The fourth TFT T4 includes the first initialization semiconductor layer 130d and a first initialization gate electrodes 125d1 and 125d2 (i.e., the first initialization gate electrode G4 of FIG. 8). The first initialization semiconductor layer 130d includes a first initialization source region 176d and the first initialization drain region 177d that may be doped with impurities, and a first initialization channel region located between the first initialization source region 176d and the first initialization drain region 177d. The first initialization channel region may correspond to a portion of the first initialization semiconductor layer 130d overlapping the first initialization gate electrodes 125d1 and 125d2, and the first initialization gate electrodes 125d1 and 125d2 may correspond to a portion of the previous scan line SL−1. The first initialization source region 176d is connected to the initialization voltage line VL through an initialization connecting line 173. An end of the initialization connecting line 173 may be connected to the initialization voltage line VL through a contact hole 161, and the other end of the initialization connecting line 173 may be connected to the first initialization source region 176d through a contact hole 162.

The fifth TFT T5 includes the operation control semiconductor layer 130e and an operation control gate electrode 125e (i.e., the operation control gate electrode G5 of FIG. 8). The operation control semiconductor layer 130e includes an operation control source region 176e and an operation control drain region 177e that may be doped with impurities, and an operation control channel region located between the operation control source region 176e and the operation control drain region 177e. The operation control channel region may correspond to a portion of the operation control semiconductor layer 130e overlapping the operation control gate electrode 125e, and the operation control gate electrode 125e may correspond to a portion of the emission control line EL. The operation control source region 176e may be electrically connected to the driving voltage line PL through a contact hole 165.

The sixth TFT T6 includes the emission control semiconductor layer 130f and an emission control gate electrode 125f (i.e., the emission control gate electrode G6 of FIG. 8). The emission control semiconductor layer 130f includes an emission control source region 176f and an emission control drain region 177f that may be doped with impurities, and an emission control channel region located between the emission control source region 176f and the emission control drain region 177f. The emission control channel region may correspond to a portion of the emission control semiconductor layer 130f overlapping the emission control gate electrode 125f, and the emission control gate electrode 125f may correspond to a portion of the emission control line EL.

The emission control drain region 177f may be connected to a conductive layer 175 through a contact hole 163. The conductive layer 175 may be electrically connected to the pixel electrode of the OLED through a contact hole 183.

The seventh TFT T7 includes the second initialization semiconductor layer 130g and a second initialization gate electrode 125g (i.e., the second initialization gate electrode G7 of FIG. 8). The second initialization semiconductor layer 130g includes a second initialization source region 176g and a second initialization drain region 177g that may be doped with impurities, and a second initialization channel region located between the second initialization source region 176g and the second initialization drain region 177g. The second initialization channel region may correspond to a portion of the second initialization semiconductor layer 130g overlapping the second initialization gate electrode 125g, and the second initialization gate electrode 125g may correspond to a portion of the previous scan line SL−1.

The second initialization source region 176g of the seventh TFT T7 may be connected to the emission control drain region 177f of the sixth TFT T6 and the pixel electrode of the OLED, and the second initialization drain region 177g may be connected to the first initialization source region 176d of the fourth TFT T4 and the initialization voltage line VL. The seventh TFT T7 may be turned on according to the previous scan signal Sn−1 received through the previous scan line SL−1 to initialize the pixel electrode of the OLED.

Referring to FIG. 9, the data line DL and the driving voltage line PL extend in the first direction (e.g., the direction Dr1), and the scan line SL, the previous scan line SL−1, the emission control line EL, and the initialization voltage line VL extend in the second direction (e.g., the direction Dr2). In an embodiment, the data line DL and the driving voltage line PL extending in the first direction may include a first metal (e.g., aluminum). The scan line SL, the previous scan line SL−1, the emission control line EL, and the initialization voltage line VL extending in the second direction may include a second metal (e.g., molybdenum). The first metal may be a flexible metal, and the second metal may be more vulnerable to stress than the first metal.

The scan line SL, the previous scan line SL−1, the emission control line EL, and the initialization voltage line VL extending in the second direction continuously extend in the main display area DA1 and first side display area DA4 as described with reference to FIG. 4. In contrast, the scan line SL of one pixel and the scan line SL of an adjacent pixel may be separated from each other in the first edge display area DA2 and may be connected through one of the plurality of connection wirings. Likewise, the previous scan line SL−1, the emission control line EL, and the initialization voltage line VL of one pixel and the previous scan line SL−1, the emission control line EL, and the initialization voltage line VL of an adjacent pixel may be separated from each other and may be connected through one of the plurality of connection wirings.

Figure 10:
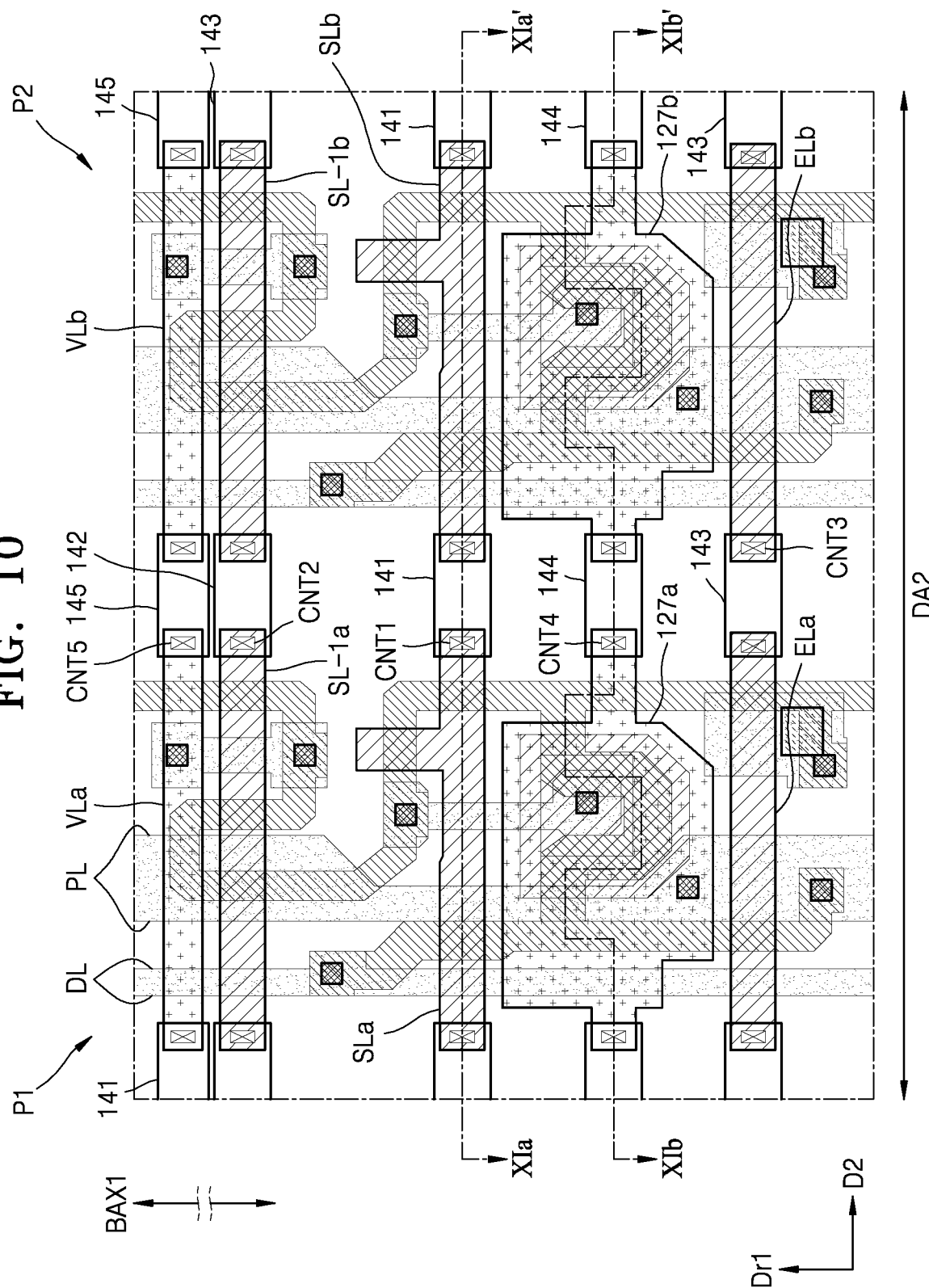
FIG. 10 is a plan view illustrating a part of a first edge display area of the display device according to an embodiment.
Figure 11A:
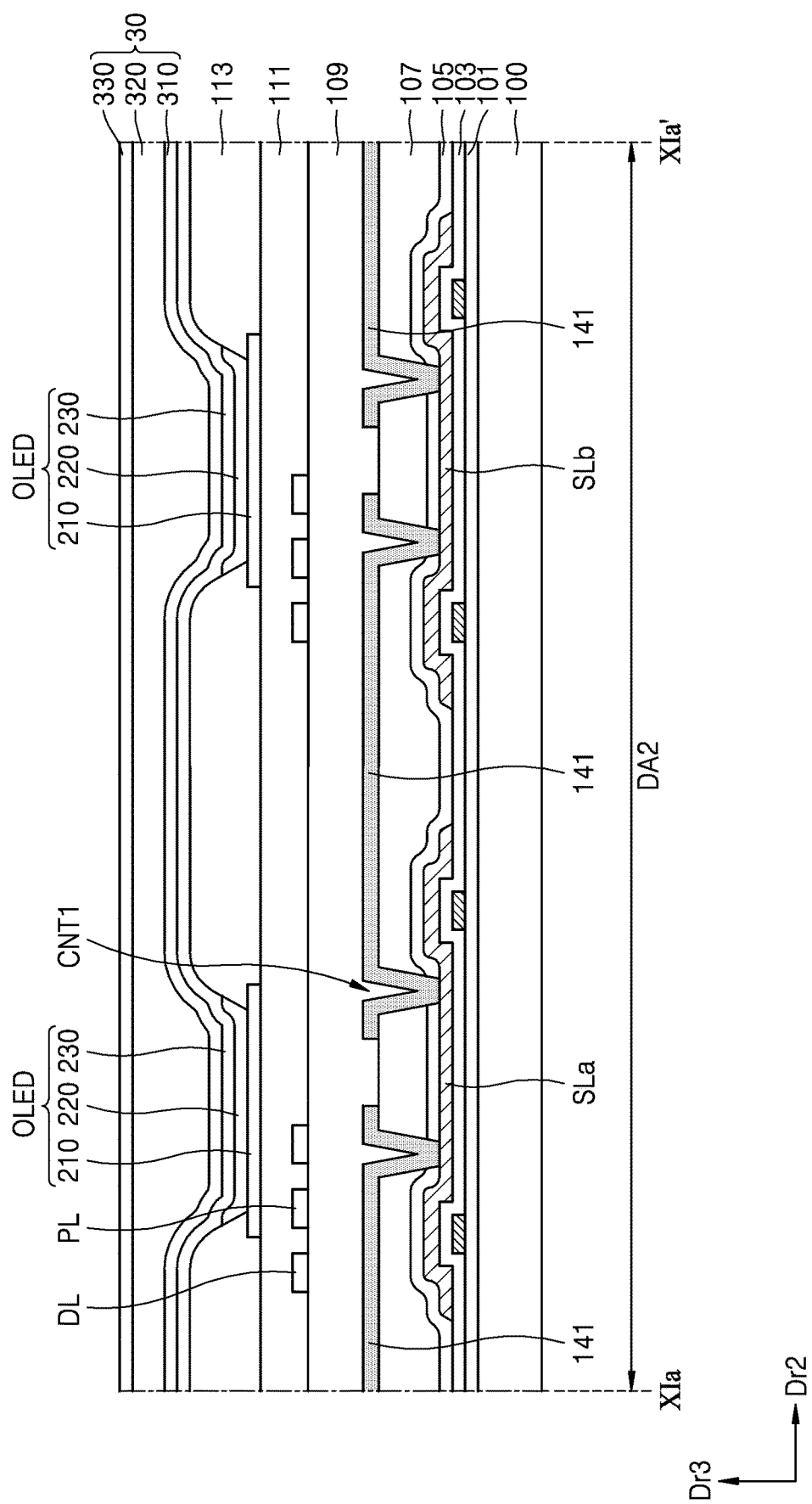
FIG. 11A is a cross-sectional view taken along line XIa-XIa' of FIG. 10.
Figure 11B:
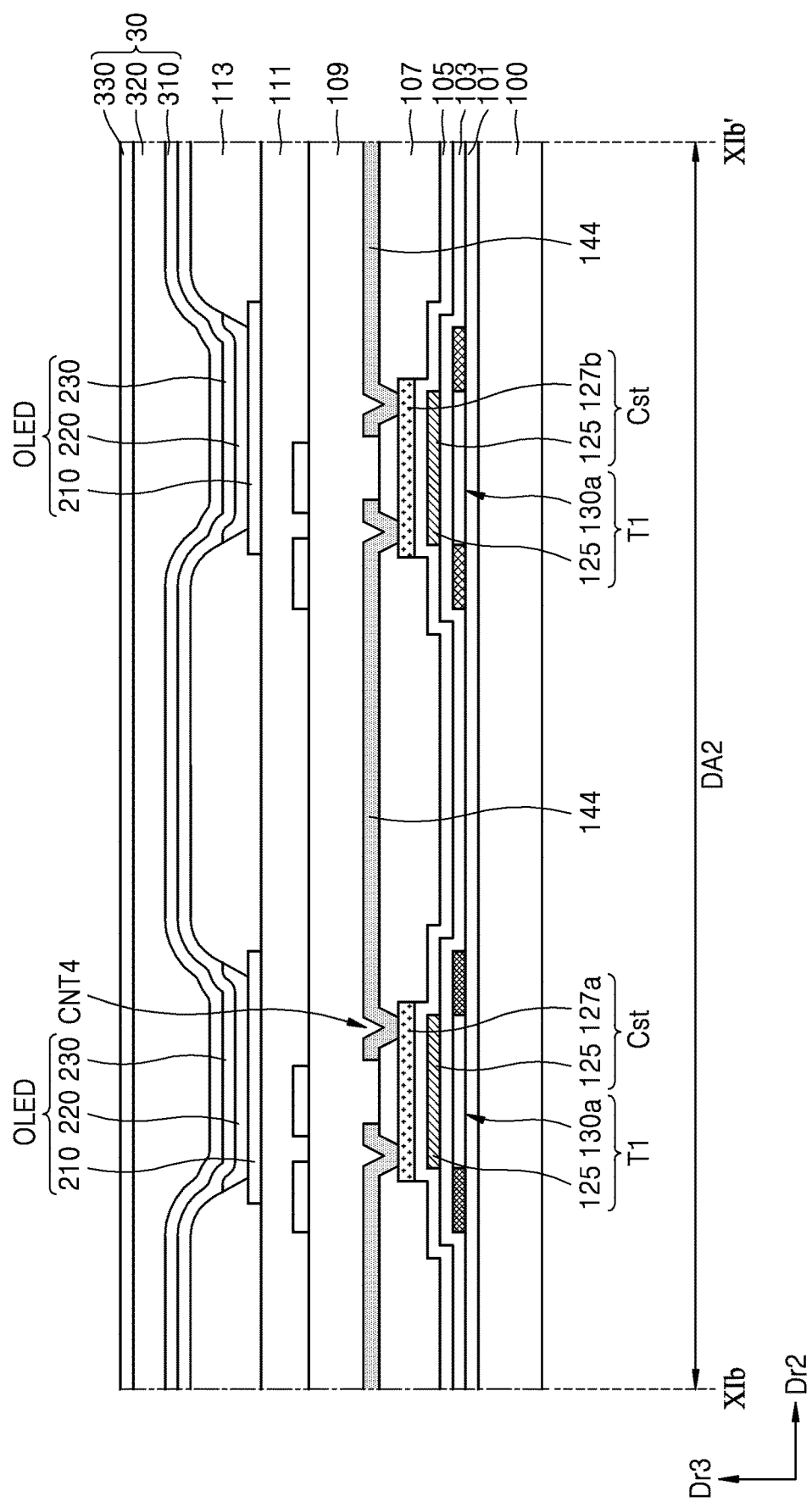
FIG. 11B is a cross-sectional view taken along line XIb-XIb' of FIG. 10.

FIG. 10 is a plan view illustrating a part of the first edge display area DA2 of the display device 10 according to an embodiment. FIG. 11A is a cross-sectional view taken along line XIa-XIa' of FIG. 10. FIG. 11B is a cross-sectional view taken along line XIb-XIb' of FIG. 10. Although FIGS. 11A and 11B are cross-sectional views of the first edge display area DA2 that is bent with respect to the first axis BAX1 described with reference to FIG. 2, FIGS. 11A and 11B illustrate a state prior to bending the first edge display area DA2 for convenience.

Referring to FIG. 10, the first edge display area DA2 is bent with respect to the first axis BAX1 in the first direction, and first and second pixels P1 and P2 that are adjacent to each other are located in the first edge display area DA2. Each of the neighboring first and second pixels P1 and P2 includes a pixel circuit (e.g., the pixel circuit PC of FIG. 8) and a display element. The pixel circuit of each first and second pixels P1 and P2 may include TFTs (e.g., T1 through T7), a storage capacitor (e.g., Cst1), and wirings as described in FIGS. 3 and 10. The neighboring first and second pixels P1 and P2 respectively include first and second scan lines SLa and SLb, first and second previous scan lines SL−1a and SL−1b, first and second emission control lines ELa and ELb, and first and second initialization voltage lines VLa and VLb, and wirings thereof are separated from one another.

The first scan line SLa of the first pixel P1 and the second scan line SLb of the second pixel P2 are separated from each other and are connected by a first connection wiring 141.

Referring to FIG. 11A, the first scan line SLa and the second scan line SLb that are separated from each other may be located on the substrate 100. A buffer layer 101 and a gate insulating layer 103 may be disposed between the substrate 100 and the first and second scan lines SLa and SLb. Each of the buffer layer 101 and the gate insulating layer 103 may include an inorganic insulating layer such as silicon oxide and silicon nitride.

The first and second scan lines SLa and SLb may be covered by one or more insulating layers, for example, first and second interlayer insulating layers 105 and 107. The first connection wiring 141 located on the second interlayer insulating layer 107 connects the first and second scan lines SLa and SLb through first contact holes CNT1 that are formed through the first and second interlayer insulating layers 105 and 107.

The first connection wiring 141 may include a metal having an elastic modulus less than that of the first and second scan lines SLa and SLb, for example, aluminum. The first connection wiring 141 may function as a bridge wiring. In addition, the first connection wiring 141 may prevent or minimize an external impact from being transmitted to the first and second scan lines SLa and SLb since the first connection wiring 141 is located on (over) the first and second scan lines SLa and SLb.

The first connection wiring 141 may be covered by a third interlayer insulating layer 109. The data line DL and the driving voltage line PL are located on the third interlayer insulating layer 109. The data line DL and the driving voltage line PL may be covered by a planarization insulating layer 111 that may be formed of an organic insulating material. The first interlayer insulating layer 105 may be an inorganic insulating layer such as silicon oxide and silicon nitride. The second and third interlayer insulating layers 107 and 109 may be inorganic insulating layers, or organic insulating layers including polyimide.

Since the first scan line SLa of the first pixel P1 and the second scan line SLb of the second pixel P2 are electrically connected to each other by the first connection wiring 141, the same scan signal may be applied to the first scan line SLa and the second scan line SLb.

Each of the first and second pixels P1 and P2 includes an OLED including a pixel electrode 210, an intermediate layer 220 including an emission layer, and a counter electrode 230. Edges of the pixel electrode 210 may be covered by a pixel defining layer 113 and a center region of the pixel electrode 210 may be exposed through an opening of the pixel defining layer 113. The intermediate layer 220 may overlap and contact the pixel electrode 210 through the opening. The OLEDs may be protected from the outside by an encapsulation member 30 disposed on the OLEDs. In FIG. 11, the encapsulation member 30 includes a first inorganic encapsulation layer 310, an organic encapsulation layer 320, and a second inorganic encapsulation layer 330.

Referring to FIG. 10, similar to the first and second scan lines SLa and SLb, the first and second previous scan lines SL−1a and SL−1b may be connected by a second connection wiring 142 through second contact holes CNT2, and the first and second emission control lines ELa and ELb may be connected by a third connection wiring 143 through third contact holes CNT3. The first and second previous scan lines SL−1a and SL−1b and the first and second emission control lines ELa and ELb may include the same material as that of the first and second scan lines SLa and SLb. The first and second previous scan lines SL−1a and SL−1b and the first and second emission control lines ELa and ELb may be located on the same layer as that of the first and second scan lines SLa and SLb. The second and third connection wirings 142 and 143 may include the same material as that of the first connection wiring 141. The second and third connection wirings 142 and 143 may be located on the same layer (e.g., the gate insulating layer 103 of FIG. 11A) as that of the first connection wiring 141.

Referring to FIGS. 10 and 11B, the first TFT T1 and the storage capacitor Cst may overlap each other. The storage capacitor Cst of the first pixel P1 includes a lower storage capacitor plate 125 and first upper storage capacitor plate 127a, and the storage capacitor Cst of the second pixel P2 includes the lower storage capacitor plate 125 and the second upper storage capacitor plate 127b.

The first upper storage capacitor plate 127a of the first pixel P1 and the second upper storage capacitor plate 127b of the second pixel P2 may be separated from each other and may be connected by a fourth connection wiring 144. The fourth connection wiring 144 may include a metal having an elastic modulus less than that of the first and second upper storage capacitor plates 127a and 127b.

The first and second upper storage capacitor plates 127a and 127b are located on the first interlayer insulating layer 105 and are covered by the second interlayer insulating layer 107. The fourth connection wiring 144 may be located on the second interlayer insulating layer 107 and may be connected to the first and second upper storage capacitor plates 127a and 127b through fourth contact holes CNT4 that are formed through the second interlayer insulating layer 107.

Similar to the first and second upper storage capacitor plates 127a and 127b, the first and second initialization voltage lines VLa and VLb may be connected to a fifth connection wiring 145 through fifth contact holes CNT5. The first and second initialization voltage lines VLa and VLb may include the same material as that of the first and second upper storage capacitor plates 127a and 127b. The first and second initialization voltage lines VLa and VLb may be located on the same layer (e.g., the second interlayer insulating layer 107) as that of the first and second upper storage capacitor plates 127a and 127b.

Figure 12A:
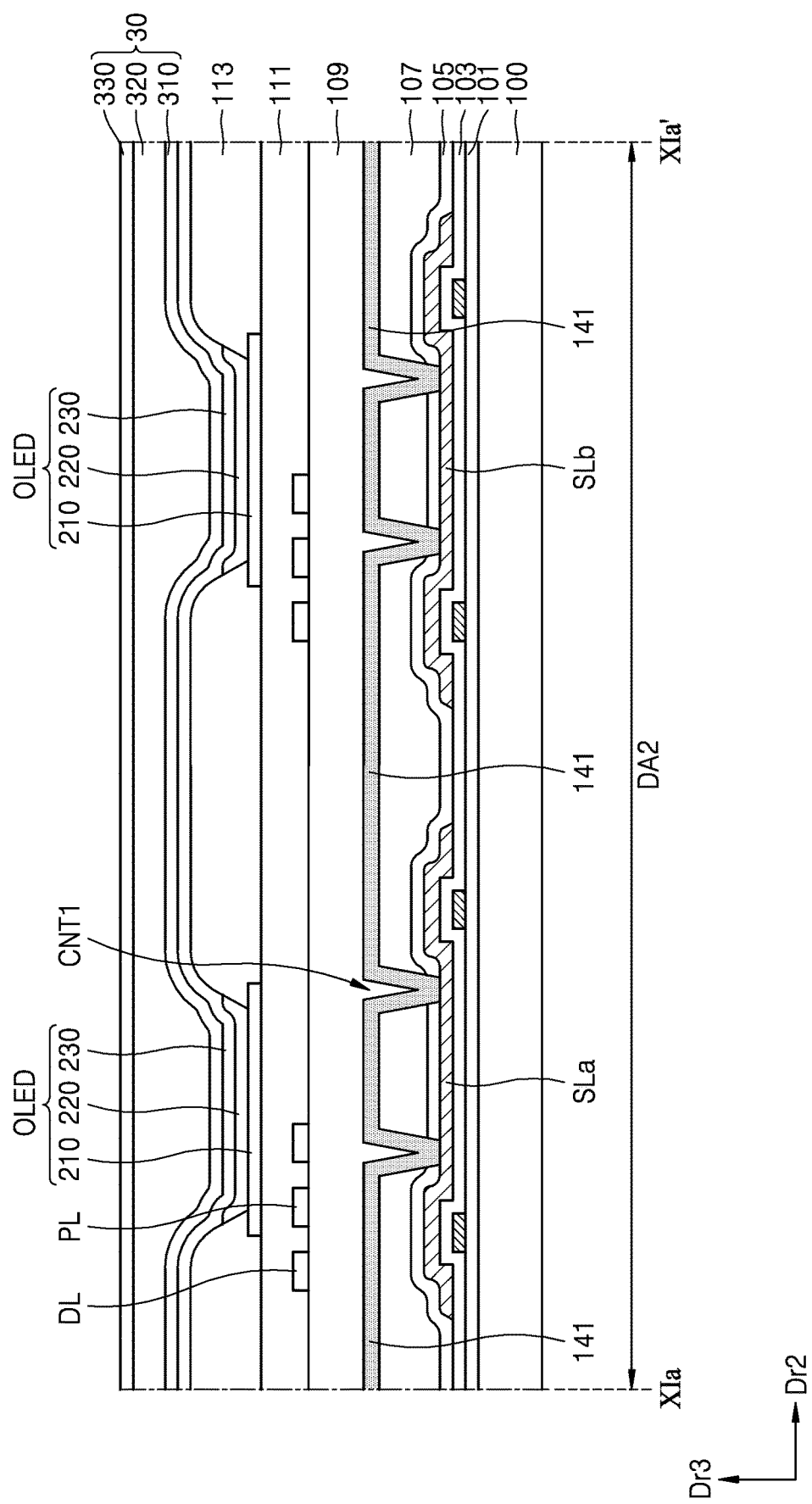
FIGS. 12A and 12B are cross-sectional views illustrating a part of the first edge display area according to another embodiment.
Figure 12B:
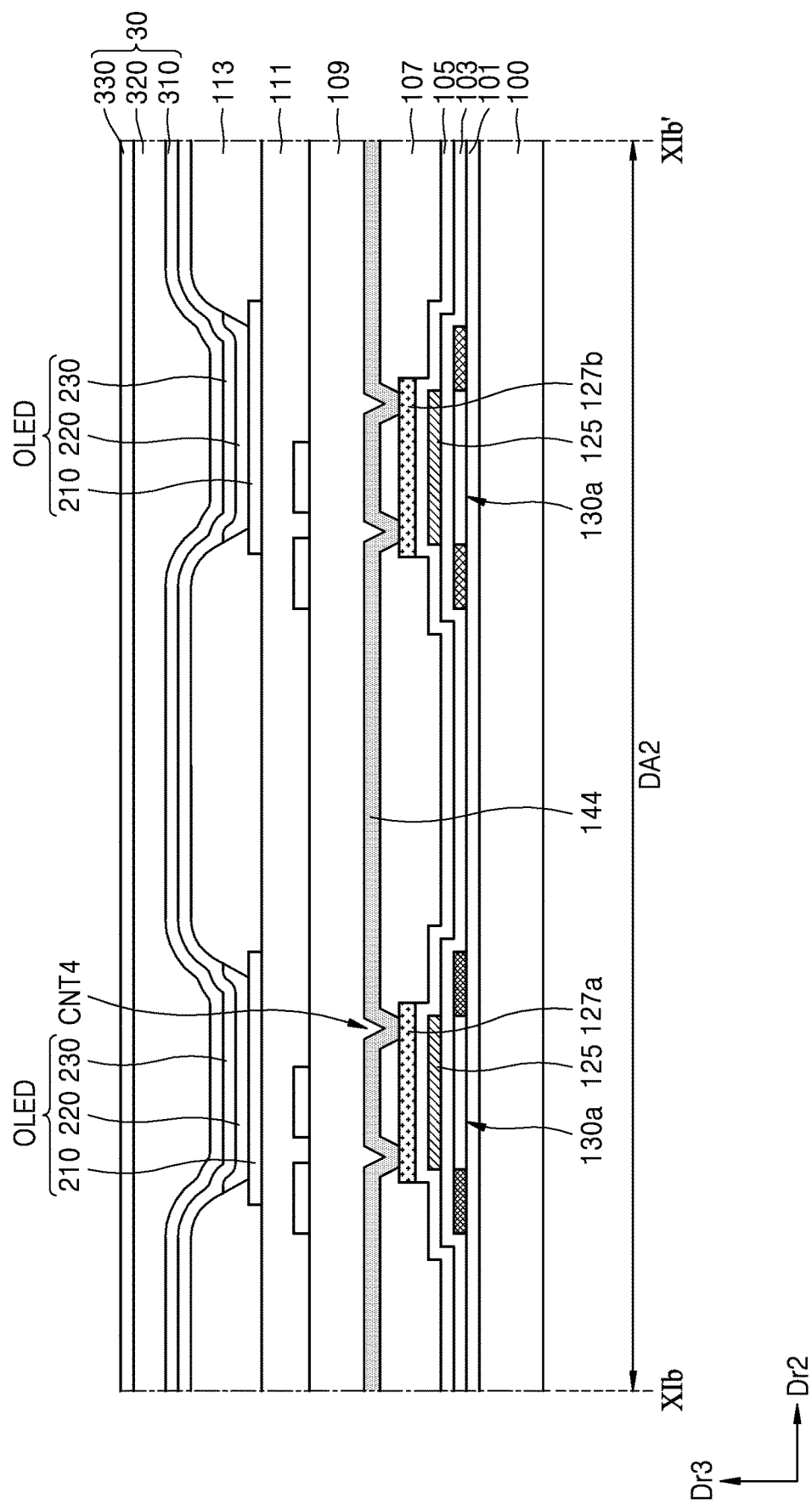

FIGS. 12A and 12B are cross-sectional views illustrating a part of the first edge display area DA2 according to another embodiment.

Referring to FIGS. 12A and 12B, the first connection wiring 141 and the fourth connection wiring 144 may continuously extend in the second direction to cross the first edge display area DA2. Although not shown, the second connection wiring 142, the third connection wiring 143, and/or the fifth connection wiring 145 may continuously extend in the second direction in the first edge display area DA2 in a similar manner as the first and fourth connecting wirings 141 and 144.

In one embodiment, the first connection wiring 141 that continuously extends may function as an auxiliary wiring. For example, when any one of the scan lines including the first and second lines SLa and SLb that are located in the first edge display area DA2 to be separated from each other is damaged, a scan signal may be transmitted to the scan lines located in the first edge display area DA2 through the first connection wiring 141. Likewise, each of the second through fifth connection wirings 142, 143, 144, and 145 may function as an auxiliary wiring.

Figure 13A:
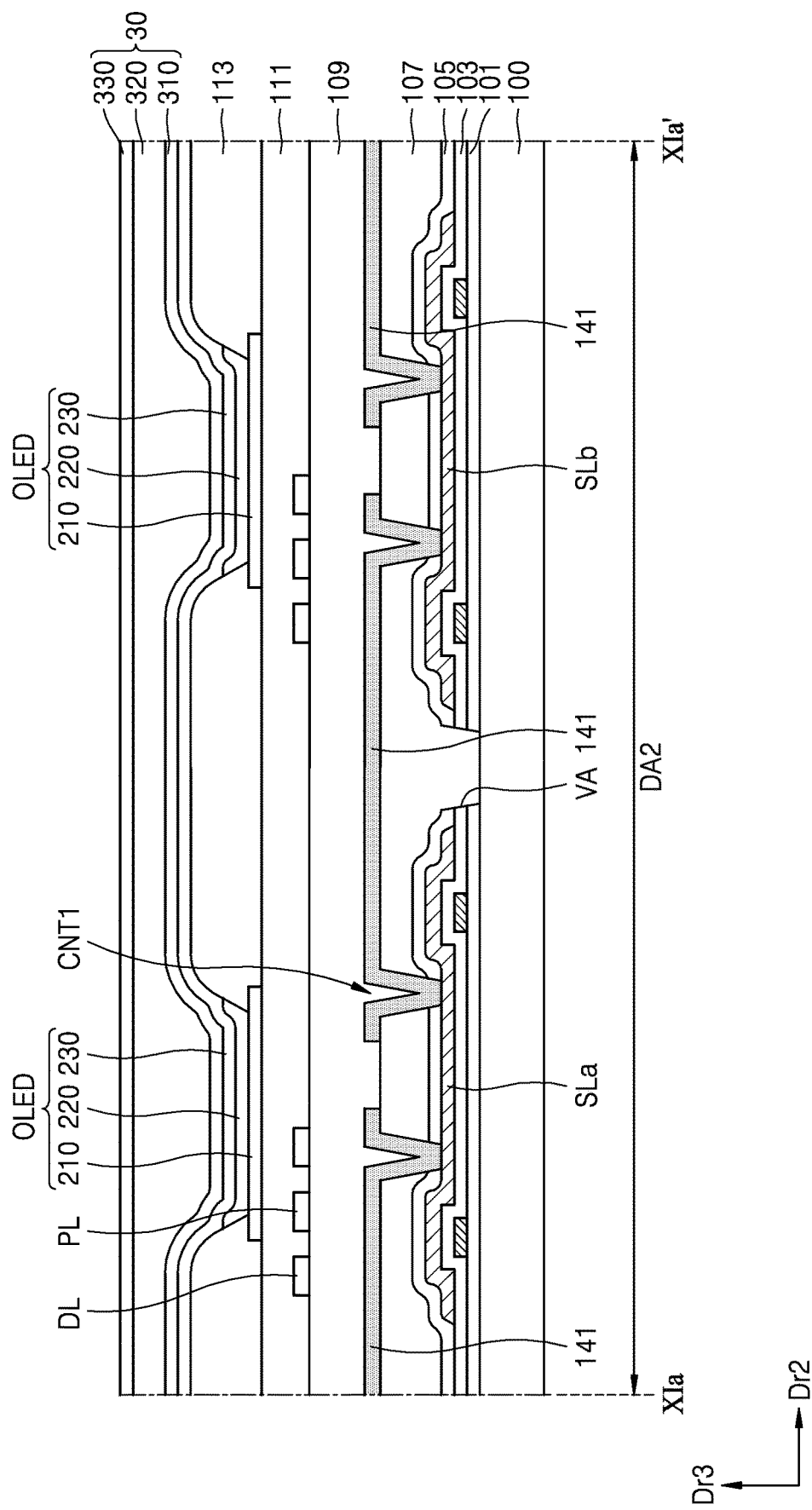
FIGS. 13A and 13B are cross-sectional views illustrating a part of the first edge display area according to another embodiment.
Figure 13B:
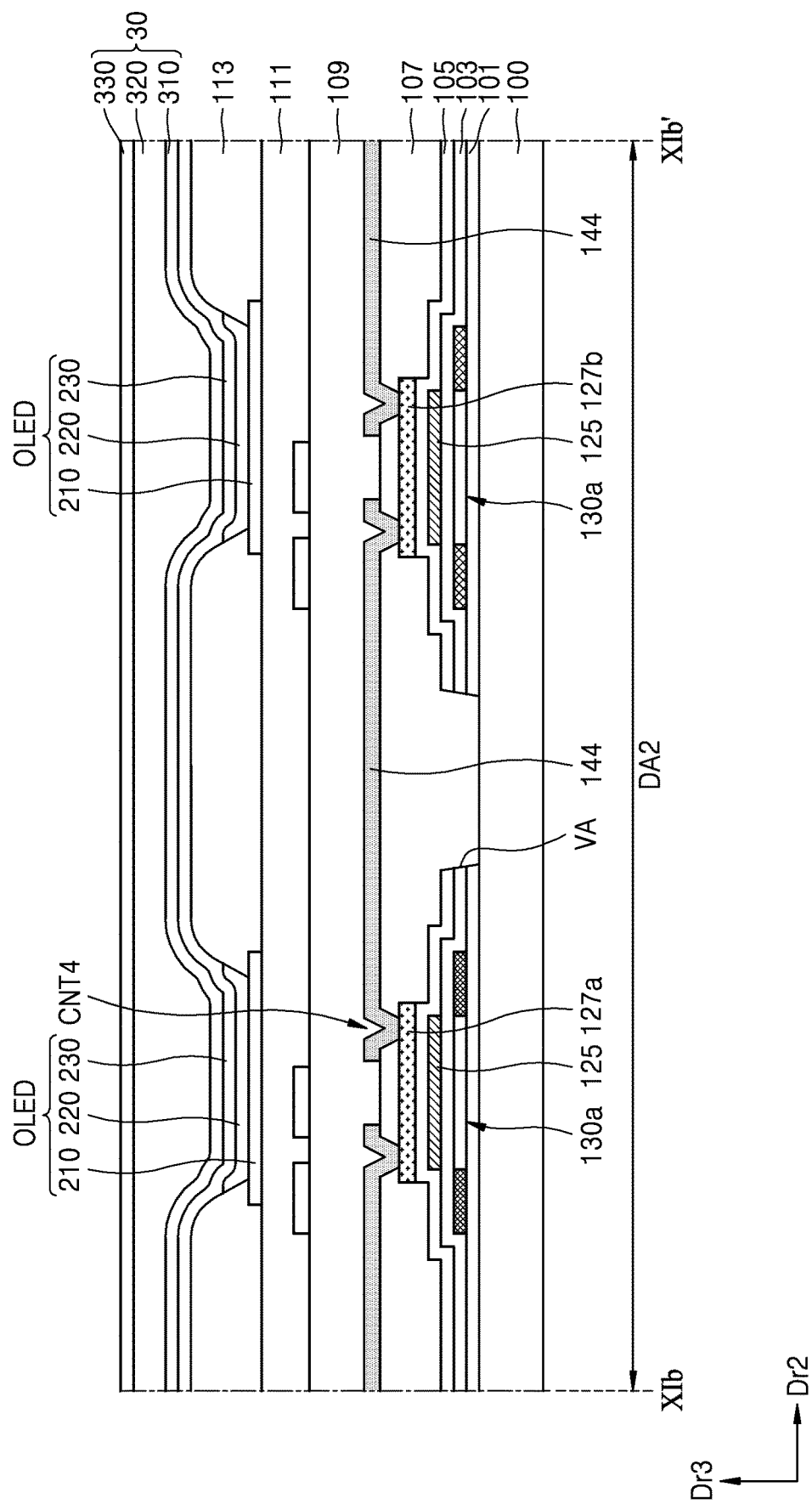

FIGS. 13A and 13B are cross-sectional views illustrating a part of the first edge display area DA2 according to another embodiment.

Referring to FIGS. 13A and 13B, a stacked structure including the buffer layer 101, the gate insulating layer 103, and the first interlayer insulating layer 105 that are inorganic insulating layers may have a valley VA. The valley VA is an opening or a groove formed by removing a portion of the inorganic insulating layers.

The valley VA may be filled with the second interlayer insulating layer 107. The second interlayer insulating layer 107 may be an organic insulating layer. Since the organic insulating layer may absorb an external impact better than an inorganic insulating layer, the probability that the external impact is transmitted to the inorganic insulating layers or adjacent wirings may be reduced. The second interlayer insulating layer 107 may fill the valley VA and may entirely cover the first edge display area DA2.

The valley VA may be located between adjacent wirings, for example, the first and second scan lines SLa and SLb as shown in FIG. 13A or may be located between the first and second upper storage capacitor plates 127a and 127b as shown in FIG. 13B. Likewise, the valley VA may be located between the first and second previous scan lines SL−1a and SL−1b, between the first and second emission control lines ELa and ELb, and between the first and second initialization voltage lines VLa and VLb.

Figure 14A:
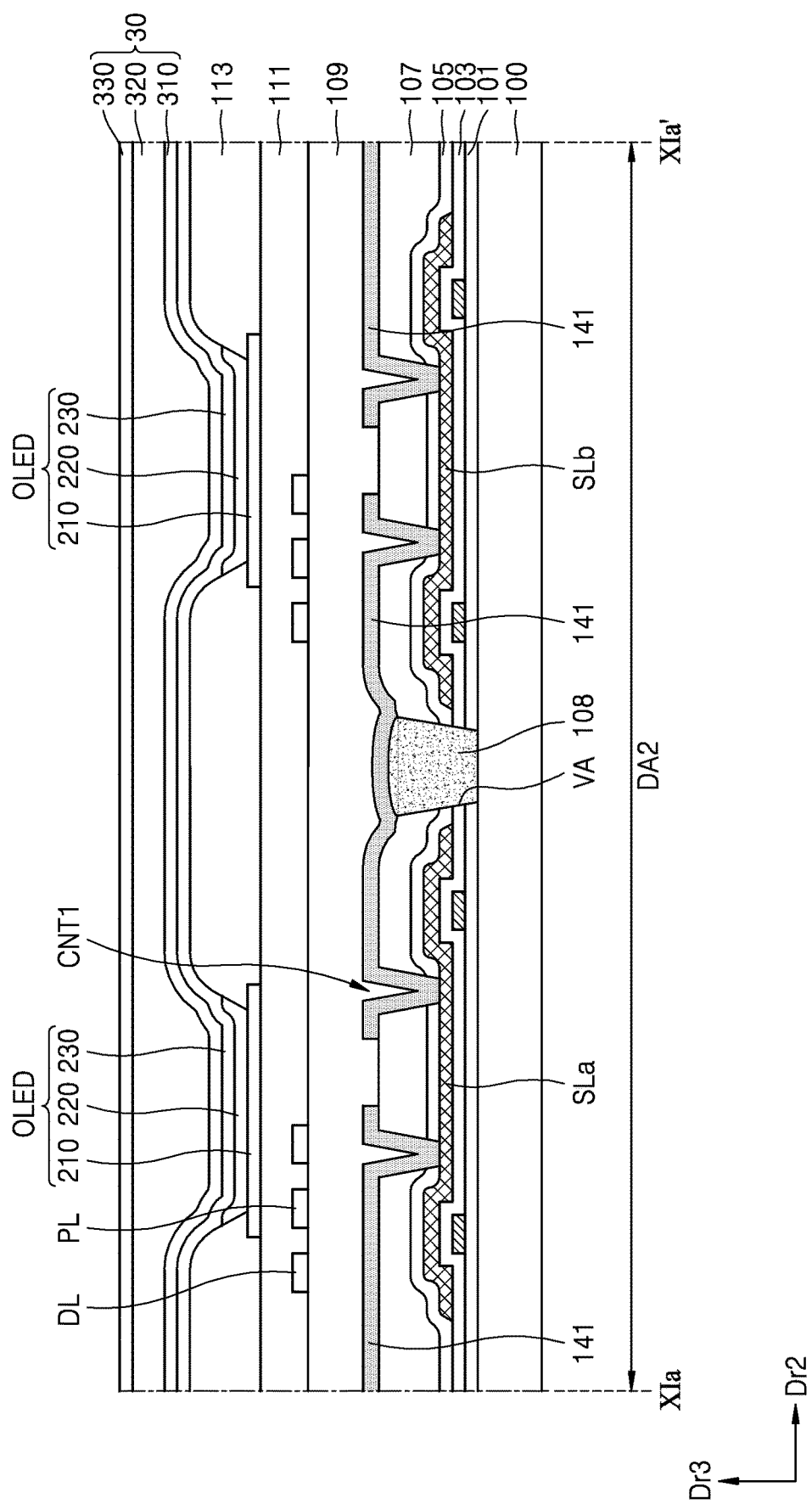
FIGS. 14A and 14B are cross-sectional views illustrating a part of the first edge display area according to another embodiment.
Figure 14B:
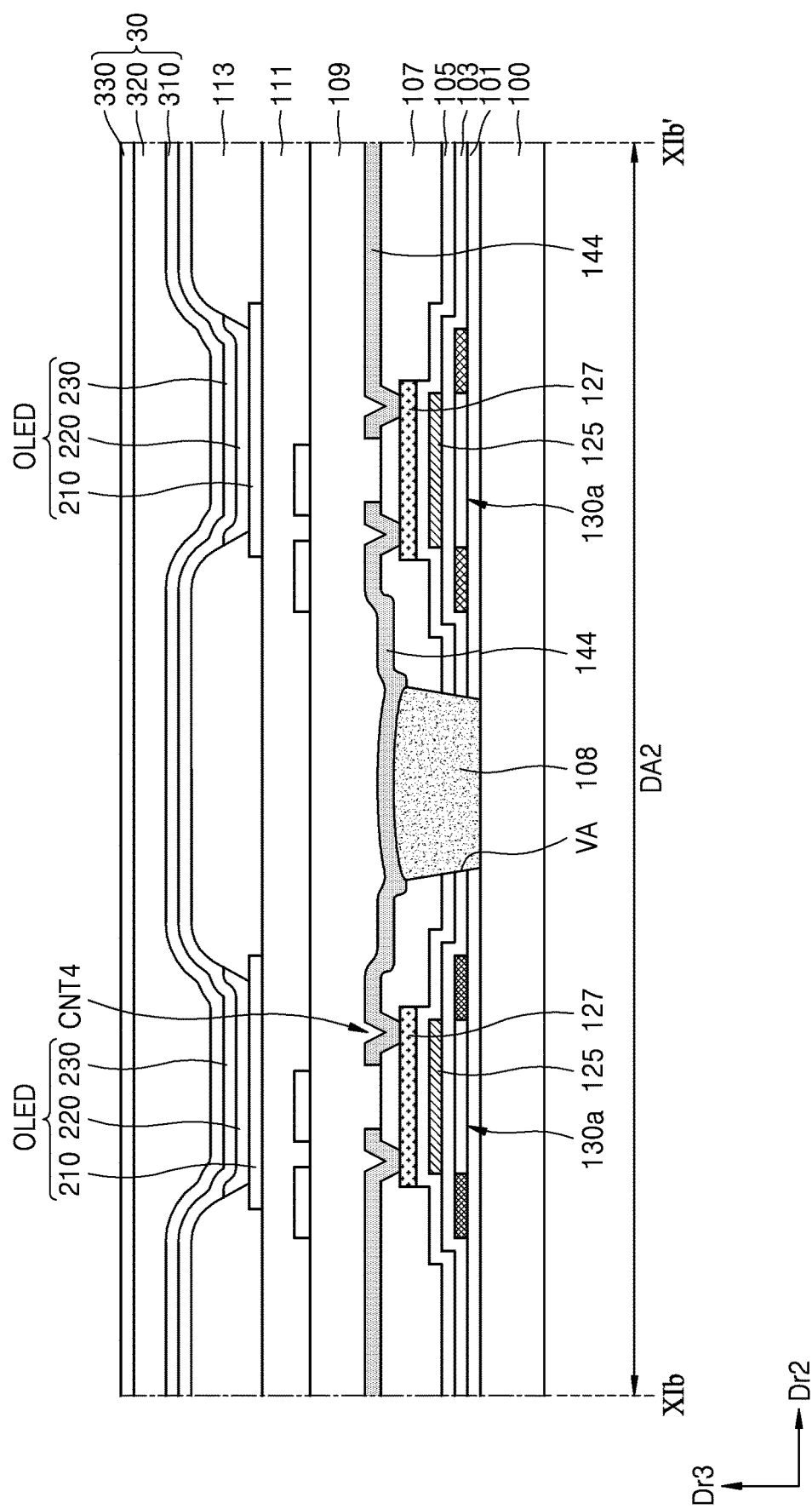

FIGS. 14A and 14B are cross-sectional views illustrating a part of the first edge display area DA2 according to another embodiment.

Referring to FIGS. 14A and 14B, the second interlayer insulating layer 107 may be an inorganic insulating layer. The second interlayer insulating layer 107 may have an opening corresponding to the valley VA. The valley VA and the opening may be filled with an organic insulating layer 108. The organic insulating layer 108 may be locally formed on a portion corresponding to the valley VA and the opening partially covering the first edge display area DA2. The first and fourth connection wirings 141 and 144 may be located on the second interlayer insulating layer 107 and the organic insulating layer 108.

Although the first through fifth connection wirings 141, 142, 143, 144, and 145 are separated from one another in a direction (e.g., the direction Dr2) intersecting a bending axis of the first edge display area DA2 as shown in FIGS. 13A through 14B, the present disclosure is not limited thereto. As described with reference to FIGS. 12A and 12B, each of the first through fifth connection wirings 141, 142, 143, 144, and 145 may be continuously formed in the direction intersecting the bending axis of the first edge display area DA2.

A display device according to the one or more embodiments of the present disclosure may reduce an amount of stress applied to a wiring that crosses an edge display area that is bent with respect to a first axis and may reduce a radius of curvature of the edge display area. In addition, the display device may minimize a deviation of stress applied to wirings according to positions in a display area that is bent with respect to a plurality of axes, thereby providing a stereoscopic display device having any of various shapes. However, it is understood that the scope of the present disclosure is not limited by the effect.

While the present disclosure has been particularly shown and described with reference to embodiments thereof, it will be understood that various changes in form and details may be made therein without departing from the spirit and scope of the present disclosure. Accordingly, the true technical scope of the present disclosure is defined by the technical spirit of the appended claims.

What is claimed is:

1. A display device comprising:
 a substrate including a main display area and an edge display area that is bent with respect to a first axis and extending from the main display area;
 a wiring including a plurality of sub-wirings that are in the edge display area having a curvature and are arranged in a direction intersecting the first axis;
 an insulating layer on the plurality of sub-wirings and including a plurality of contact holes;
 a connection wiring on the insulating layer and connecting the plurality of sub-wirings through the plurality of contact holes;
 a display element in the edge display area;
 a thin-film transistor electrically connected to the display element, and comprising a semiconductor layer and a gate electrode; and
 a data line electrically connected to the thin-film transistor,
 wherein the connection wiring is interposed between the gate electrode and the data line.

2. The display device of claim 1, wherein an elastic modulus of the connection wiring is less than an elastic modulus of the plurality of sub-wirings.

3. The display device of claim 1, further comprising:
 a scan line electrically connected to the display element, wherein the wiring comprises the scan line.

4. The display device of claim 1, wherein the plurality of sub-wirings and the gate electrode comprise a same material.

5. The display device of claim 1, further comprising:
 a driving thin-film transistor located in the edge display area; and
 a storage capacitor including a lower storage capacitor plate and an upper storage capacitor plate,
 wherein the driving thin-film transistor and the storage capacitor overlap each other.

6. The display device of claim 5, wherein the plurality of sub-wirings and the upper storage capacitor plate comprise a same material.

7. The display device of claim 1, further comprising a side display area connected to the edge display area and located on a plane different from the main display area.

8. A display device comprising:
 a substrate including a main display area, a first edge display area located on a first side of the main display area, and a second edge display area located on a second side of the main display area, wherein the first edge display area and the second edge display area are respectively bent with respect to a first axis and a second axis;

a plurality of display elements located in the main display area, the first edge display area, and the second edge display area;

a wiring electrically connected to the plurality of display elements, the wiring including a plurality of sub-wirings that are in the first edge display area having a curvature and spaced apart from one another along an intersection direction that intersects the first axis;

an insulating layer disposed on the plurality of sub-wirings and having a plurality of contact holes;

a plurality of connection wirings disposed on the insulating layer and connecting the plurality of sub-wirings through the plurality of contact holes;

a thin-film transistor including a semiconductor layer and a gate electrode located in the first edge display area; and a data line electrically connected to the thin-film transistor, wherein the plurality of connection wirings are interposed between the gate electrode and the data line.

9. The display device of claim 8, wherein the plurality of connection wirings are located in the first edge display area and are spaced apart from one another along the intersecting direction.

10. The display device of claim 8, wherein an elastic modulus of the plurality of connection wirings is less than an elastic modulus of the plurality of sub-wirings.

11. The display device of claim 8, wherein the plurality of connection wirings comprise aluminum.

12. The display device of claim 8,
wherein the plurality of sub-wirings and the gate electrode comprise a same material.

13. The display device of claim 8, further comprising a side display area extending from the first edge display area and located on a plane perpendicular to the main display area.

14. The display device of claim 13, further comprising an encapsulation member covering the main display area, the first edge display area, and the second edge display area.

* * * * *